US011424267B2

(12) United States Patent
Tessariol et al.

(10) Patent No.: US 11,424,267 B2
(45) Date of Patent: Aug. 23, 2022

(54) DIELECTRIC EXTENSIONS IN STACKED MEMORY ARRAYS

(71) Applicant: Micron Technology, Inc., Boise, ID (US)

(72) Inventors: Paolo Tessariol, Arcore (IT); Yoshiaki Fukuzumi, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/121,441

(22) Filed: Dec. 14, 2020

(65) Prior Publication Data

US 2021/0098493 A1 Apr. 1, 2021

Related U.S. Application Data

(63) Continuation of application No. 16/160,074, filed on Oct. 15, 2018, now Pat. No. 10,868,032.

(51) Int. Cl.
*H01L 27/11582* (2017.01)
*H01L 27/11573* (2017.01)
(Continued)

(52) U.S. Cl.
CPC .... *H01L 27/11582* (2013.01); *H01L 27/1157* (2013.01); *H01L 27/11565* (2013.01); *H01L 27/11573* (2013.01); *H01L 27/11575* (2013.01)

(58) Field of Classification Search
CPC ......... H01L 27/11565; H01L 27/11573; H01L 27/11575; H01L 27/11582
See application file for complete search history.

(56) References Cited

U.S. PATENT DOCUMENTS

| | | | |
|---|---|---|---|
| 8,617,947 | B2 | 12/2013 | Yang et al. |
| 9,773,805 | B1 | 9/2017 | Li et al. |

(Continued)

FOREIGN PATENT DOCUMENTS

| | | | |
|---|---|---|---|
| CN | 103824859 | A | 5/2014 |
| CN | 108063142 | A | 5/2018 |

(Continued)

OTHER PUBLICATIONS

U.S. Appl. No. 16/029,144, entitled "Integrated Assemblies Having Thicker Semiconductor Material Along One Region of a Conductive Structure Than Along Another Region, and Methods of Forming Integrated Assemblies", filed Jul. 6, 2018, (63 pgs.).

(Continued)

*Primary Examiner* — Brigitte A Paterson
*Assistant Examiner* — Molly K Reida
(74) *Attorney, Agent, or Firm* — Brooks, Cameron & Huebsch, PLLC

(57) ABSTRACT

In an example of forming a stacked memory array, a stack of alternating first and second dielectrics is formed. A dielectric extension is formed through the stack such that a first portion of the dielectric extension is in a first region of the stack between a first group of semiconductor structures and a second group of semiconductor structures in a second region of the stack and a second portion of the dielectric extension extends into a third region of the stack that does not include the first and second semiconductor structures. An opening is formed through the first region, while the dielectric extension couples the alternating first and second dielectrics in the third region to the alternating first and second dielectrics in the second region.

18 Claims, 18 Drawing Sheets

(51) Int. Cl.

| | |
|---|---|
| ***H01L 27/11575*** | (2017.01) |
| ***H01L 27/1157*** | (2017.01) |
| ***H01L 27/11565*** | (2017.01) |

(56) References Cited

U.S. PATENT DOCUMENTS

| | | | |
|---|---|---|---|
| 10,181,442 | B1 | 1/2019 | Watanabe et al. |
| 2012/0208347 | A1 | 8/2012 | Hwang et al. |
| 2013/0049096 | A1 | 2/2013 | Wang |
| 2014/0138765 | A1 | 5/2014 | Lee et al. |
| 2015/0235939 | A1 | 8/2015 | Lee et al. |
| 2017/0250108 | A1 | 8/2017 | Mathew et al. |
| 2017/0358595 | A1 | 12/2017 | Freeman et al. |
| 2018/0047739 | A1 | 2/2018 | Dorhout et al. |
| 2018/0130814 | A1 | 5/2018 | Lee |
| 2018/0240813 | A1 | 8/2018 | Lee et al. |
| 2018/0269227 | A1 | 9/2018 | Carlson |
| 2019/0006275 | A1* | 1/2019 | Kobayashi ........ H01L 21/76802 |
| 2019/0393238 | A1 | 12/2019 | Lim et al. |

FOREIGN PATENT DOCUMENTS

| | | |
|---|---|---|
| KR | 10-2012-0121746 | 11/2012 |
| WO | 2017213720 A1 | 12/2017 |
| WO | 2018161836 | 9/2018 |

OTHER PUBLICATIONS

U.S. Appl. No. 15/992,959, entitled "Arrays of Elevationally-Extending Strings of Memory Cells and Methods of Forming an Array of Elevationally-Extending Strings of Memory Cells", filed May 30, 2018, (41 pgs.).

U.S. Appl. No. 15/710,432, entitled "Methods Used in Forming an Array of Elevationally-Extending Transistors" filed Sep. 20, 2017, (56 pgs.).

International Search Report and Written Opinion for related PCT Application No. PCT/US2019/056212, dated Jan. 31, 2020, 10 pages.

Office Action from related China Patent Application No. 201980067484.2, dated Mar. 29, 2022, 22 pages.

Partial Search Report from related European Patent Application No. 19874727.1, dated Jun. 3, 2022, 12 pages.

* cited by examiner

DIELECTRIC EXTENSIONS IN STACKED MEMORY ARRAYS

PRIORITY INFORMATION

This application is a Continuation of U.S. application Ser. No. 16/160,074, filed Oct. 15, 2018, which issues as U.S. Pat. No. 10,868,032 on Dec. 15, 2020.

TECHNICAL FIELD

The present disclosure relates generally to memory arrays and their formation, and more particularly, to dielectric extensions in stacked memory arrays.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory (e.g., RRAM), and Flash memory, among others.

Memory devices can be utilized as volatile and non-volatile data storage for a wide range of electronic applications. Volatile memory may require power to maintain its data, whereas non-volatile memory may provide persistent data by retaining stored data when not powered. Flash memory, which is just one type of non-volatile memory, can use a one-transistor memory cells that allow for high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices. Memory cells can be arranged into arrays, with the arrays being used in memory devices.

Memory devices can have arrays of memory cells. Memory arrays can include groups of memory cells, such as blocks, sub-blocks, strings, etc. In some examples, a memory array can be a stacked memory array that can be referred to as a three-dimensional (3D) memory array. The memory cells at a common location (e.g., at a common vertical level) in a stacked memory array, for example, may form a tier of memory cells. The memory cells in each tier can be commonly coupled to a common access line, such as a word line. In some examples, a group of memory cells can include memory cells from different tiers coupled in series to form a string of series coupled memory cells (e.g., a NAND string) between a select transistor coupled to a source and a select transistor coupled to a data line, such as a bit line.

In some examples, the formation of stacked memory arrays can include a replacement gate process. After semiconductor structures (e.g., semiconductor pillars) are formed through a stack of alternating dielectrics, a replacement gate process can be used to remove dielectrics from the stack at levels at which memory cells are to be formed adjacent to the semiconductor structures and to form conductive access lines (e.g., metal access lines) in place of the removed dielectrics. In various examples, an opening (e.g., a slot or a slit) can be formed through the stack to provide access to the various levels in the stack in order to remove selected dielectric material layers (e.g., via an etchant) and replace them with conductive material (e.g., a metal) levels, which can serve as the access lines.

DETAILED DESCRIPTION

Figure 1:
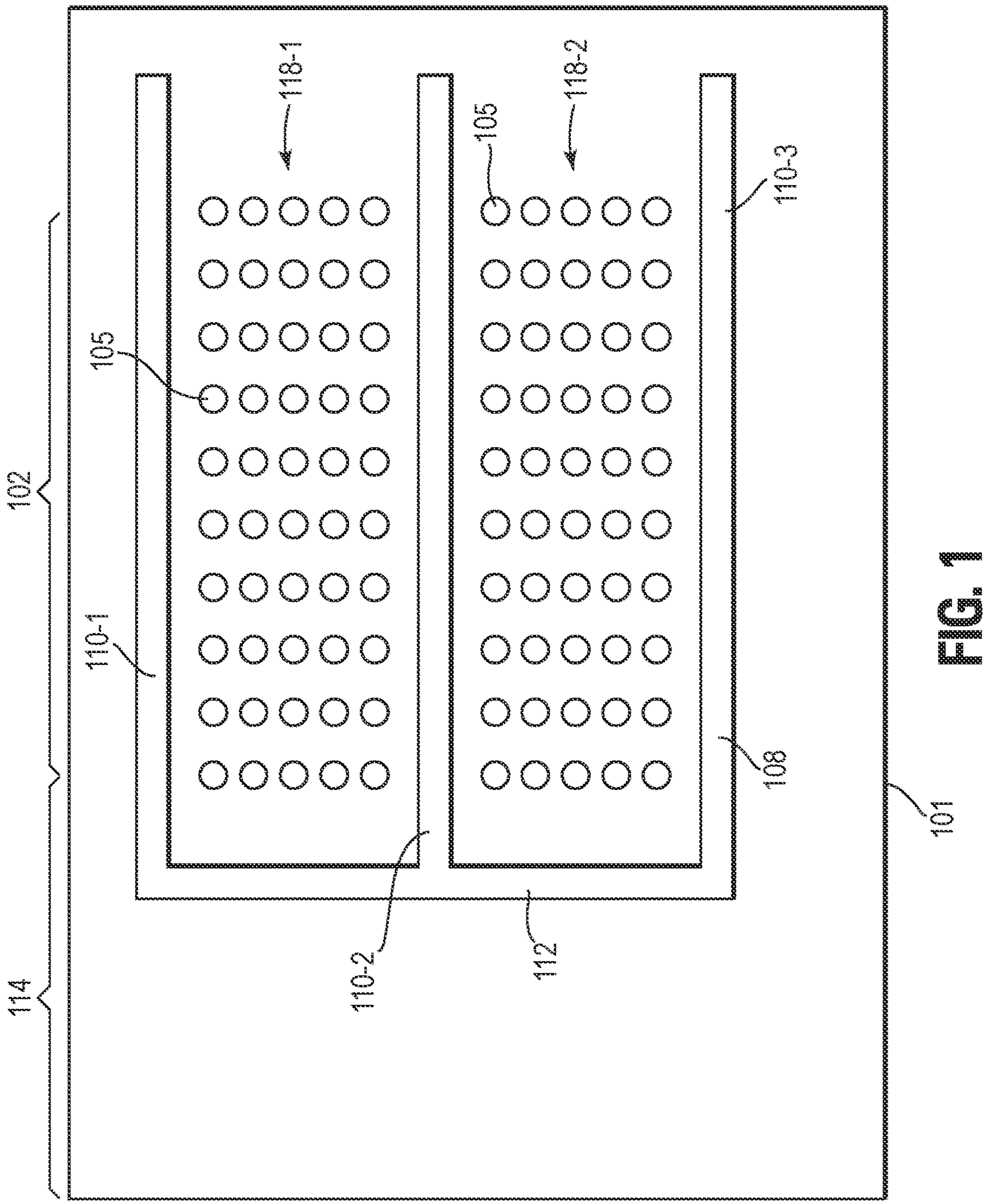
FIG. 1 is a top view at a particular processing stage associated with forming a stacked memory array, according to the background art.

Stacked memory arrays and their formation are disclosed herein. In an example method to form a stacked memory array, a dielectric extension, that can be referred to as a partition wall or a termination structure, can be formed through a stack of alternating first and second dielectrics. For example, the first dielectrics can be at levels in the stack at which memory cells are to be formed adjacent to the semiconductor structures.

The dielectric extension can extend from between groups of the semiconductor structures in a memory cell region of the stack in which the memory cells can be formed to a non-memory-cell region of the stack in which memory cells are not to be formed and that does not include the semiconductor structures. The dielectric extension can couple the alternating dielectrics in the memory cell region to the alternating dielectrics in the non-memory-cell region.

An opening can be formed between groups semiconductor structures while a dielectric extension couples the alternating dielectrics in the memory cell region to the alternating dielectrics in the non-memory-cell region. For example, the opening can provide access to the first dielectrics for their removal (e.g., as part of a replacement gate process). The coupling can restrict the movement of the semiconductor structures that can occur while the opening is formed. For example, excessive movement of the semiconductor structures can make it difficult to align data line contacts with the semiconductor structures during subsequent processing.

The first dielectrics in the memory cell region can be removed while the dielectric extension couples the second dielectrics in the memory cell region to the alternating dielectrics in the non-memory-cell region. The coupling acts to restrict the movement of the semiconductor structures that can occur while the first dielectrics are removed. In subsequent processing, metal can be formed, by supplying the metal through the opening, in spaces corresponding to the first dielectrics to form access lines while the dielectric extension couples the second dielectrics in the memory cell region to the alternating dielectrics in the non-memory-cell region. The coupling acts to restrict the movement of the semiconductor structures that can occur while the metal is formed.

In some examples, previous processing methods, such as previous replacement gate processes, can separate the nonmemory-cell region from the memory cell region during processing that can lead to excessive movement of the semiconductor structures making it difficult to align data line contacts with the semiconductor structures. In some previous approaches, "dummy" memory cells (e.g., cells that are not used to store data) can be formed adjacent to semiconductor structures where the movement of the semiconductor structures is deemed unacceptable. However, this can reduce the number of memory cells available to store data. As described above, the dielectric extension can restrict the movement of the semiconductor structures by coupling the memory cell region to the non-memory-cell region. This also can reduce the number of "dummy" memory cells.

In some examples, the openings (e.g., slots) used to access the alternating dielectrics can be formed (e.g., concurrently) by a single etch through the dielectric stack in a first direction and in a second (e.g., transverse) direction, which facilitates electrical isolation of blocks of memory cells from each other after the openings are filled with a dielectric. The transverse etch through the stack forms "T-intersections" that can be difficult to form and that can have various drawbacks. Various embodiments of the present disclosure can utilize dielectric extensions that can help isolate the blocks of memory cells from each other without forming "T-intersections," thereby avoiding the difficulties and drawbacks associated therewith. A block of memory cells can be a group of memory cells that is commonly erased, for example.

FIG. 1 is a top view at a particular processing stage associated with forming a stacked memory array, according to the background art. In FIG. 1, a stack 101 of alternating dielectrics, such as nitride alternating with oxide, can include a region 102 that can be referred to as a memory cell region, in that memory cells are to be formed in region 102. Groups 118-1 and 118-2 of semiconductor structures 105 are formed in region 102. Semiconductor structures 105 pass through stack 101 in region 102. In some examples, memory cells can be partially formed adjacent to semiconductor structures 105, such at levels of stack 101 having the nitride.

An opening 108, comprising segments 110-1, 110-2, 110-3, and 112, is formed through stack 101. For example, a removal material selective to nitride can be supplied through opening 108 to remove the nitride while leaving the oxide. In some examples, the partially formed memory cells can be completed by accessing the memory cells through opening 108. Metal, such as tungsten, can be supplied though opening 108 to form access lines that can be coupled to the memory cells. In some examples, formation of opening 108, removal of the nitride, completing the memory cells, and forming the access lines can be formed as part of a replacement gate process.

A dielectric can be formed in opening 108 to electrically isolate the access lines corresponding to group 118-1 from access lines corresponding to group 118-2. The segment 112 of opening 108 is transverse to segments 110-1 to 110-3. For example, segments 110-1 to 110-3 and 112 form respective "T-intersections." In some examples, opening 108 can be formed during a single process step (e.g., during a single etch) that can form the segments 110-1 to 110-3 and 112 concurrently. However, as an example, the "T-intersections" can be formed by performing a first etch through the stack 101 to form segments 110-1 to 110-3 and a second etch through the stack 101 to form segment 112. Forming such "T-intersections" can be difficult and can have various drawbacks. For instance, forming segment 112 can result in over etching or under etching, which can result in inadequate separation of the groups 118-1 and 118-2 or can prevent adequate electrical isolation. Also, forming segment 112 through the stack 101 can increase local stress on the blocks 118-1 and 118-2, since they are no longer anchored subsequent to formation of segment 112, which can result in increased movement of the blocks and can adversely affect the ability to accurately form connections to the structures 105 in subsequent processing stages.

Segment 112 can be formed in a region 114 of stack 101 in which memory cells are not to be formed and that can be referred to as a non-memory-cell region. For example, segment 112 can separate region 114 from the ends of groups 118-1 and 118-2. In some examples, the separation of region 114 from the ends of groups 118-1 and 118-2 can allow semiconductor structures 105 to move, such as during the formation of opening 108, during the removal of the nitride, and/or during the formation of the access lines.

The movement can make it difficult to align data line contacts with semiconductor structures 105, such as to couple data lines to the semiconductor structures 105. In some instances, the movement of semiconductor structures 105 can be relatively large at and near the ends of the ends of groups 118-1 and 118-2 and relatively little away from the ends. As such, the memory cells adjacent to the semiconductor structures 105 at and near the ends of the ends of groups 118-1 and 118-2 can be "dummy" memory cells. However, this can reduce the total number of memory cells available for data storage.

Figure 2A:
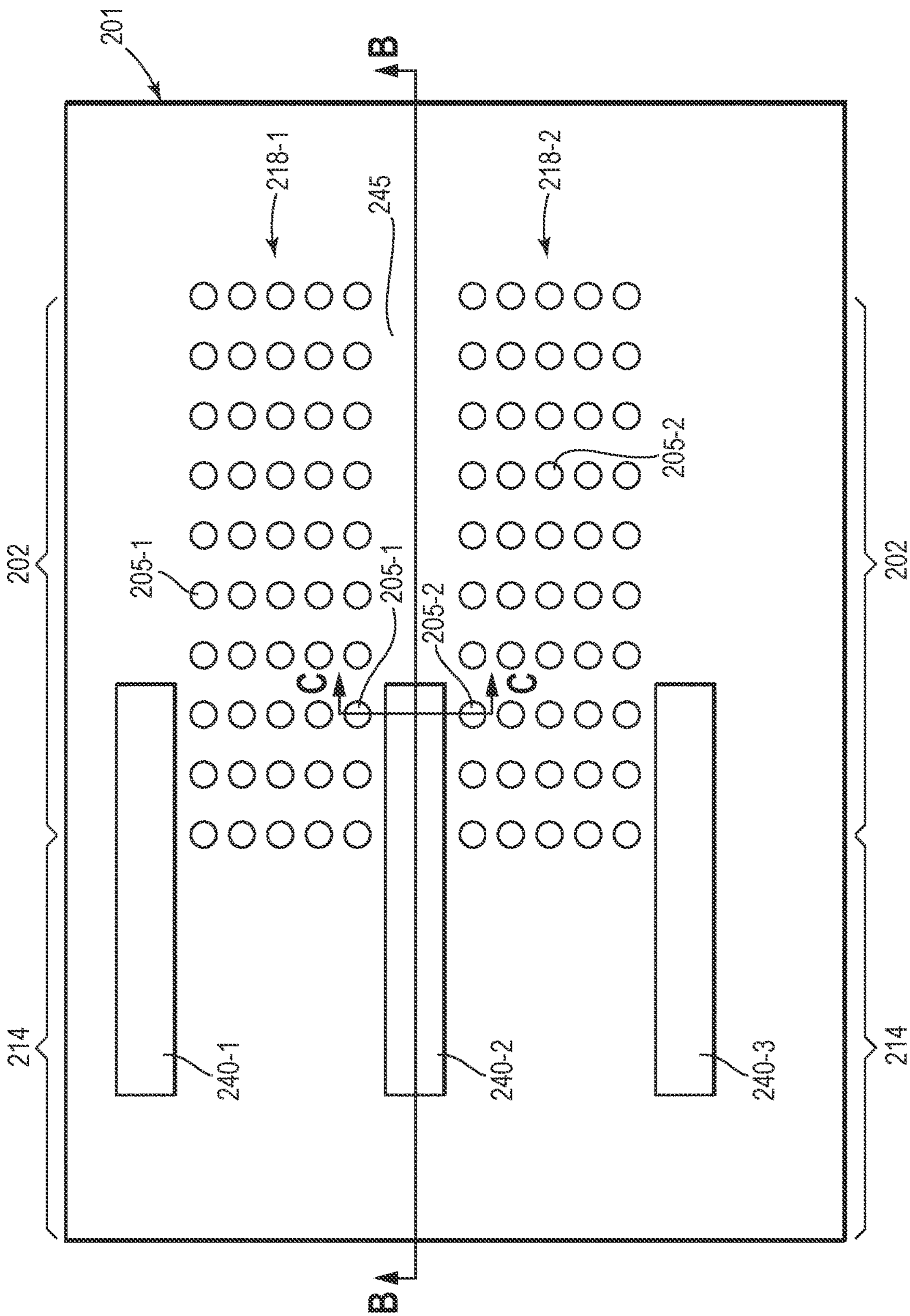
FIGS. 2A to 2P are various views corresponding to particular stages of processing associated with forming a stacked memory array in accordance with a number of embodiments of the present disclosure
Figure 2B:
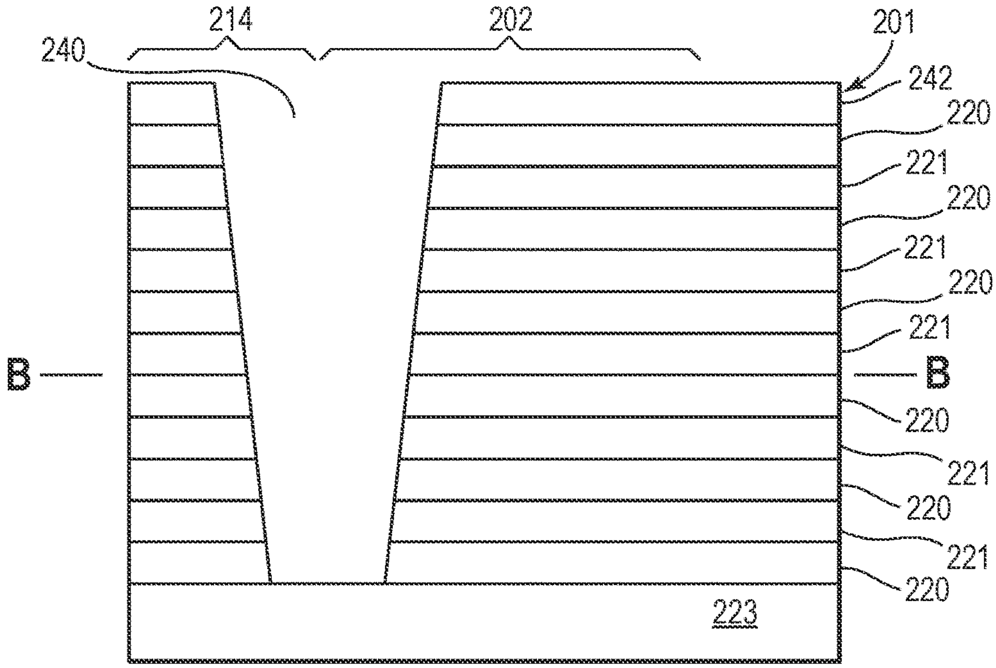
Figure 2C:
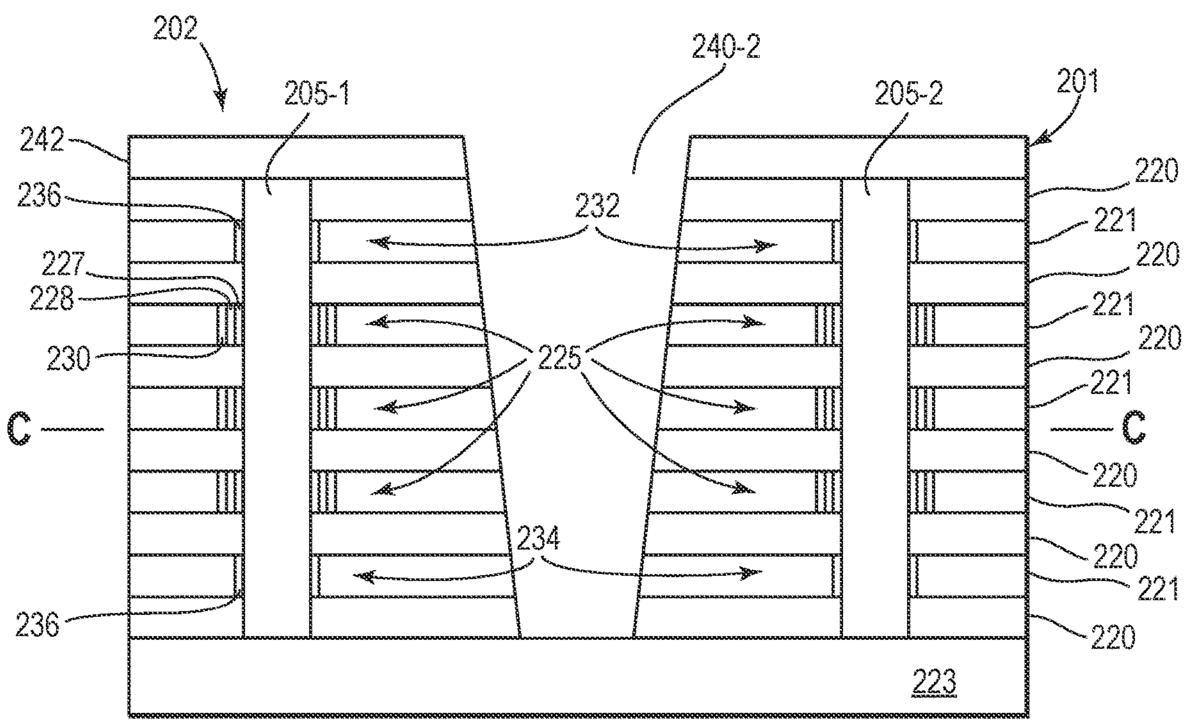

FIG. 2A is a top view corresponding to a particular stage of processing associated with forming a stacked memory array in accordance with a number of embodiments of the present disclosure. In some examples, the array can be a three-dimensional NAND memory array. FIG. 2B is a cross-section viewed along line B-B in FIG. 2A during the processing stage in FIG. 2A in accordance with a number of embodiments of the present disclosure. FIG. 2C is a cross-section viewed along line C-C in FIG. 2A in accordance with a number of embodiments of the present disclosure. FIGS. 2A-2C can correspond to a processing stage that can occur after a number of processing stages have occurred. In some examples, a processing stage can include a number of steps that can have a number of sub-steps.

A group 218-1 of semiconductor structures 205-1 passes through a region 202 of a stack 201 of alternating dielectrics 220 and 221 formed on (e.g., over) a semiconductor 223. A group 218-2 of semiconductor structures 205-2 passes through region 202 of a stack 201. In some examples, groups 218-1 and 218-2 can correspond to blocks of memory cells that are to be formed in region 202, and region 202 can be referred to as a memory cell region.

Semiconductor structures 205-1 and 205-2 and semiconductor 223 can be polysilicon, silicon conductively doped to have a p-type conductivity (e.g., single crystal $p^-$ silicon), or the like. Dielectrics 220 can be oxide, and dielectrics 221 can be nitride. For example, dielectrics 221 can be sacrificial dielectrics that can be removed during a subsequent processing stage.

In some examples, memory cells 225 can be partially formed adjacent to each semiconductor structure 205 at levels of stack 201 having dielectric 221. For example, a tunnel dielectric 227 (e.g., tunnel oxide) of a memory cell 225 can be formed adjacent to a semiconductor structure 205; a charge storage structure 228 (e.g., a charge trap, floating gate, etc.) can be formed adjacent to the tunnel dielectric 227; and a blocking dielectric 230 (e.g., oxide) can be formed adjacent to the charge storage structure 228. A dielectric 221 can be adjacent to the blocking dielectric 230. In some examples, tunnel dielectric 227, charge storage structure 228, and blocking dielectric 230 can wrap completely around (e.g., completely surround) the corresponding semiconductor structure 205.

In some examples, a select transistor 232 can be partially formed adjacent to each semiconductor structure 205 at a level of stack 201 having an uppermost dielectric 221, and a select transistor 234 can be partially formed adjacent to each semiconductor structure 205 at a level of stack 201 having a lowermost dielectric 221. For example, a gate dielectric 236 (e.g., gate oxide) of select transistors 232 and 234 can be formed adjacent to each semiconductor structure 205. A dielectric 221 can be adjacent to gate dielectrics 236. In some examples, gate dielectric 236 can wrap completely around the corresponding semiconductor structure 225. Note that semiconductor structures 205 can be formed prior to the processing stage depicted in FIGS. 2A-2C, and select transistors 232 and 234 and memory cells 225 can be partially formed prior to the processing stage depicted in FIGS. 2A-2C.

In some examples, stack 201 can include a stair-step structure (not shown in FIG. 2A) adjacent to region 202 so that region 202 can be between the stair-step structure and region 214. Respective steps of the stair-step structure can be at different levels in stack 201. Each step of the stair-step structure can include a dielectric 221 over a dielectric 220, for example.

In the processing stage corresponding to FIGS. 2A-2C, openings 240 (e.g., openings 240-1 to 240-3) are formed through stack 201. For example, a mask 242, such as imaging resist, is formed over the uppermost dielectric 220 and is patterned to define regions of stack 201 for removal. The regions defined for removal are subsequently removed (e.g., by etching) to form openings 240.

Openings 240 extend from region 202 of stack 201 that includes the semiconductor structures 205 into a region 214 in which memory cells are not to be formed. For example, region 214 can be referred to as a non-memory-cell region. Note that opening 240-2 is in a region 245 between groups 218-1 and 218-2. Opening 240-2 extends from region 245 into region 214.

Figure 2D:
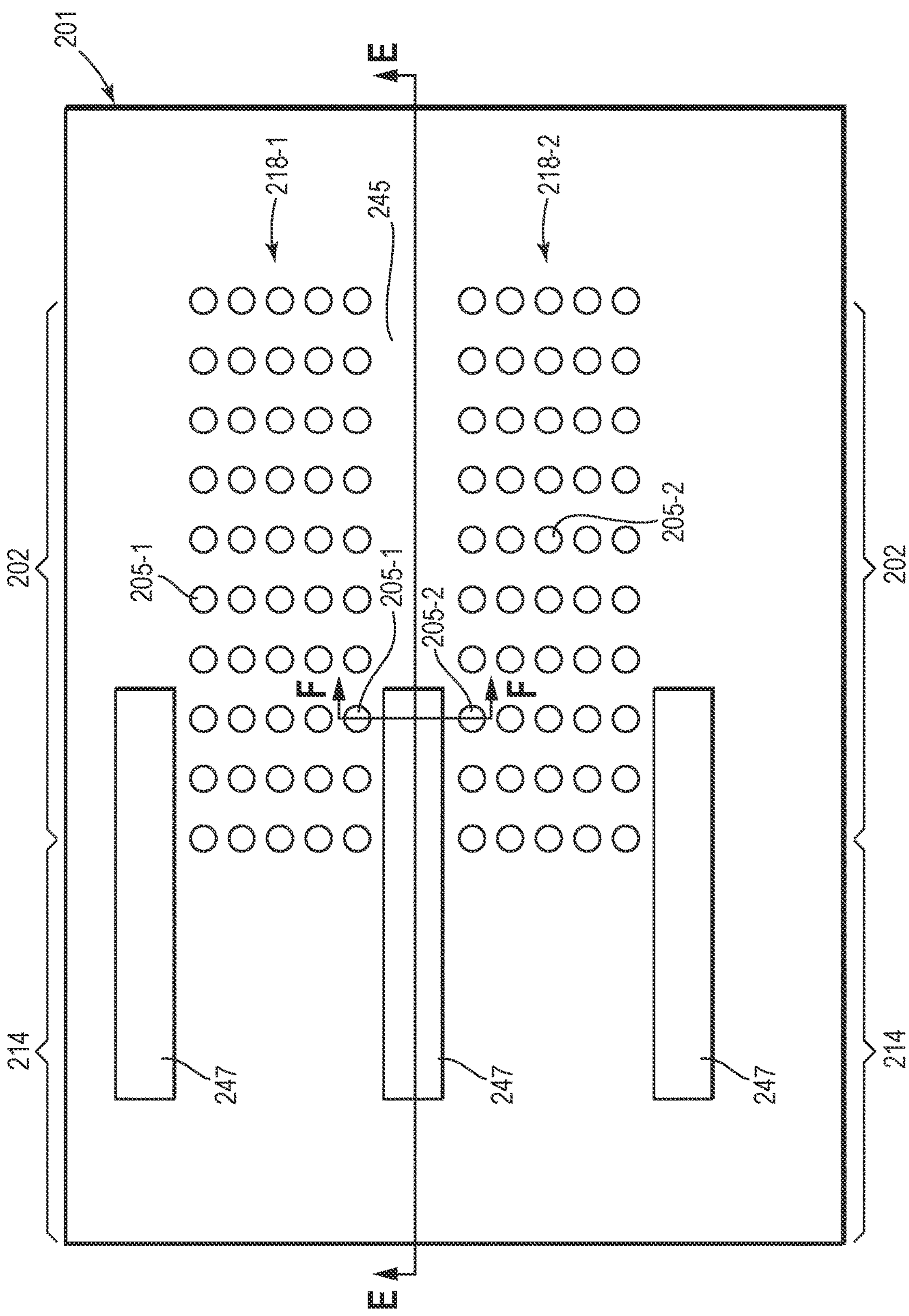
Figure 2E:
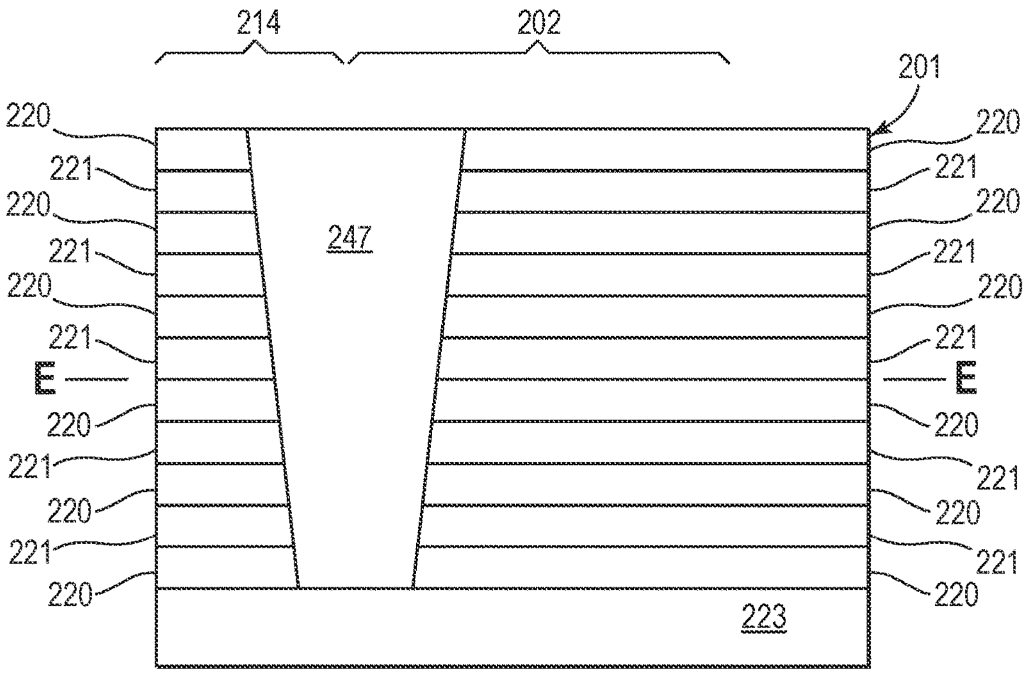
Figure 2F:
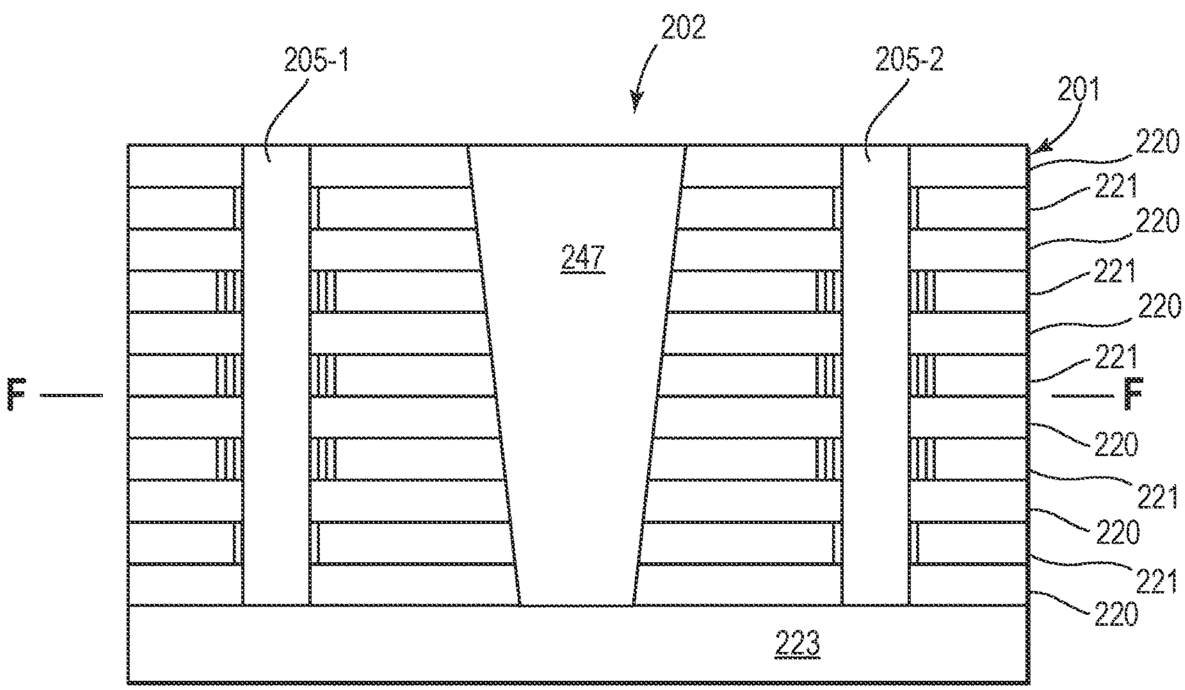

FIG. 2D is a top view corresponding to a stage of processing following the stage of processing of FIG. 2A in accordance with a number of embodiments of the present disclosure. FIG. 2E is a cross-section viewed along line E-E in FIG. 2D during the processing stage in FIG. 2D in accordance with a number of embodiments of the present disclosure. FIG. 2F is a cross-section viewed along line F-F in FIG. 2D during the processing stage in FIG. 2D in accordance with a number of embodiments of the present disclosure.

During the processing stage of FIGS. 2D-2F, a dielectric extension 247 that can be oxide is formed in the openings 240. For example, a portion of a dielectric extension 247 can be in the region 245 between the groups 218-1 and 218-2. Note that the dielectric extension 247 extends from region 245 into region 214. In some examples, dielectric extension 247 can be referred to as a termination structure, such as a partition wall termination. Note that a dielectric extension 247 can couple the alternating dielectrics 220 and 221 in region 214 to the alternating dielectrics 220 and 221, as shown in FIG. 2E.

Figure 2G:
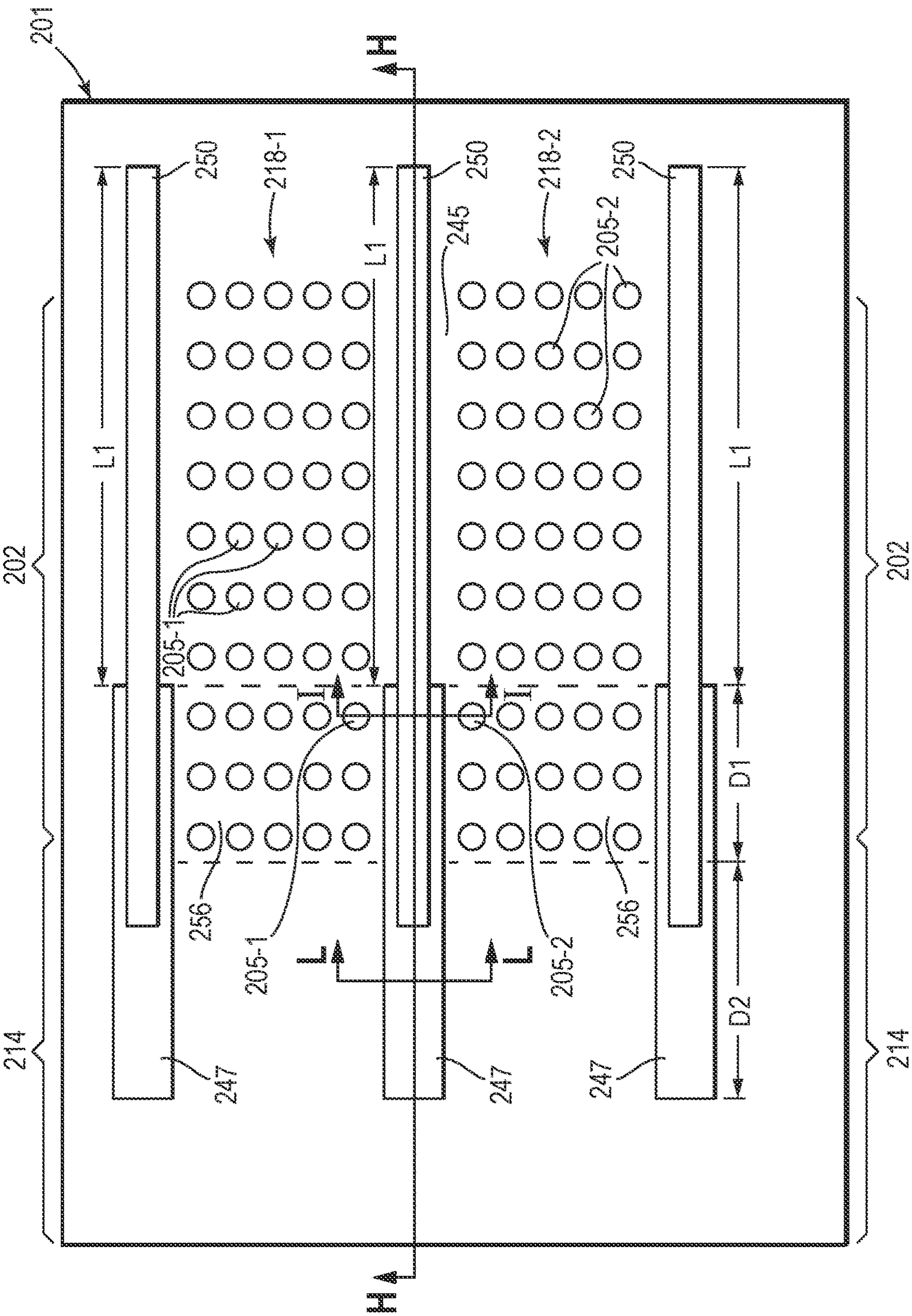
Figure 2H:
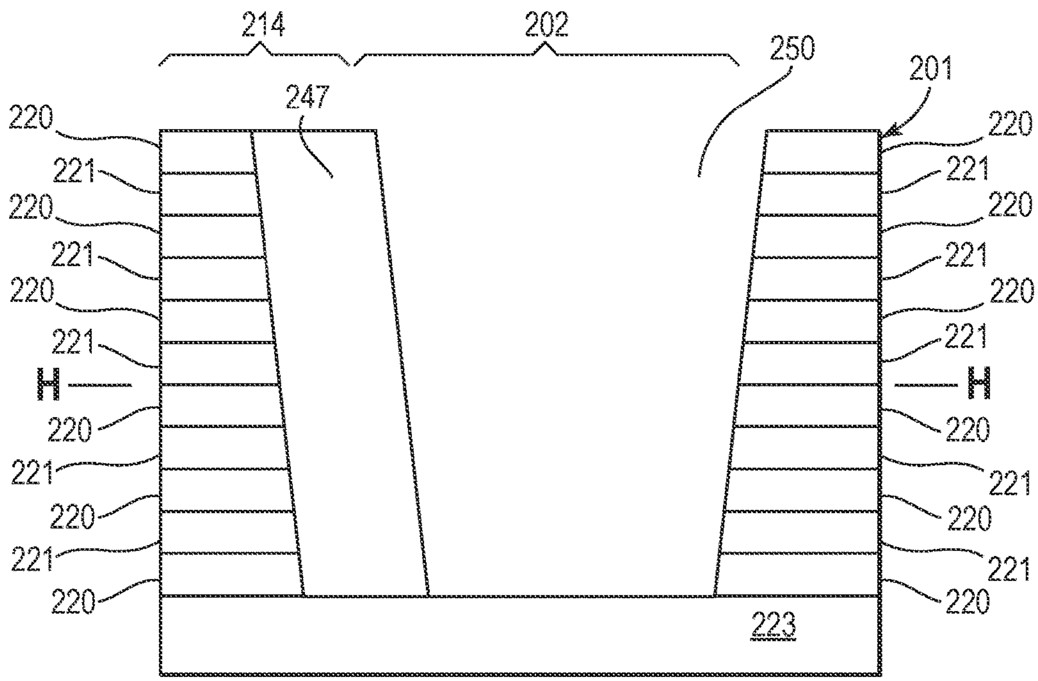
Figure 2I:
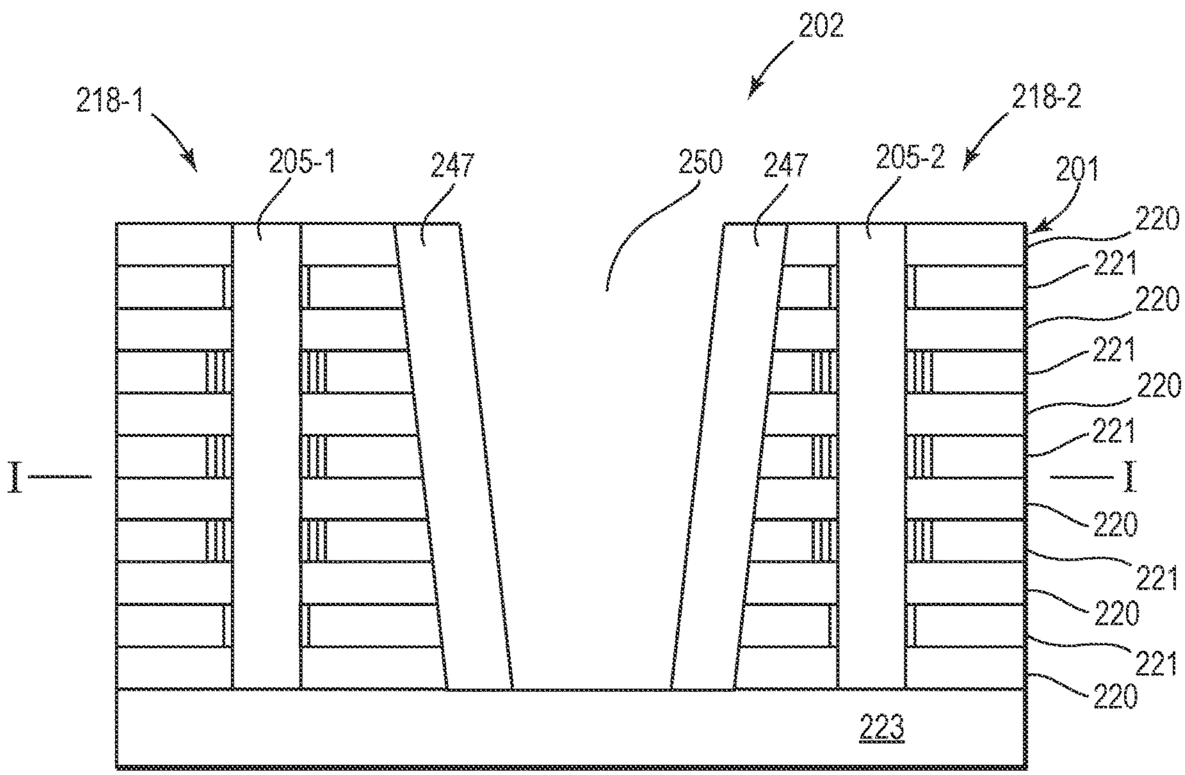

FIG. 2G is a top view corresponding to a stage of processing following the stage of processing of FIG. 2D in accordance with a number of embodiments of the present disclosure. FIG. 2H is a cross-section viewed along line H-H in FIG. 2G during a processing step of the processing stage in FIG. 2G in accordance with a number of embodiments of the present disclosure. FIG. 2I is a cross-section viewed along line I-I in FIG. 2G during the processing step of the processing stage in FIG. 2G in accordance with a number of embodiments of the present disclosure.

During the processing step of FIGS. 2H and 2I, openings 250 are formed through stack 201 and through portions of dielectric extensions 247 in region 202, stopping at an upper surface of or in semiconductor 223. For example, openings 250 can be performed as part of a replacement gate process. Dielectric extensions 247 and the corresponding openings 250 can overlap in region 202. In some examples, the overlapping of dielectric extensions 247 and the corresponding openings 250 can extend into region 214. For example, openings 250 can terminate within dielectric extensions 247. Openings 250 can provide access to alternating dielectrics 220 and 221 and to the groups 218-1 and 218-2.

As shown in FIG. 2G, one of openings 250 is formed in the region 245. As shown in FIGS. 2G and 21, an opening 250 passes through a central portion of a dielectric extension 247 where the opening 250 and the dielectric extension 247 overlap. For example, where the opening 250 and the dielectric extension 247 overlap, dielectric extension 247 can line the opening 250, as shown in FIG. 2I. For example, as shown in FIG. 2I, a portion of dielectric extension 247 is between the opening 250 and group 218-1 and another portion of dielectric extension 247 is between the opening 250 and group 218-2.

Note that dielectric extensions 247 couple the alternating dielectrics 220 and 221 in region 214 to the alternating dielectrics 220 and 221 in region 202 while openings 250 are formed. This coupling restricts movement of the semiconductor structures 205 that could occur while openings 250 are formed. The structure of FIG. 2G omits the formation of the transverse segment 112 in FIG. 1, and thus avoids the difficulties associated with forming transverse segment 112. Moreover, the movement of the semiconductors associated with transverse segment 112 can be reduced as a result of dielectric extensions 247 coupling the alternating dielectrics 220 and 221 in region 214 to the alternating dielectrics 220 and 221 in region 202.

Figure 2J:
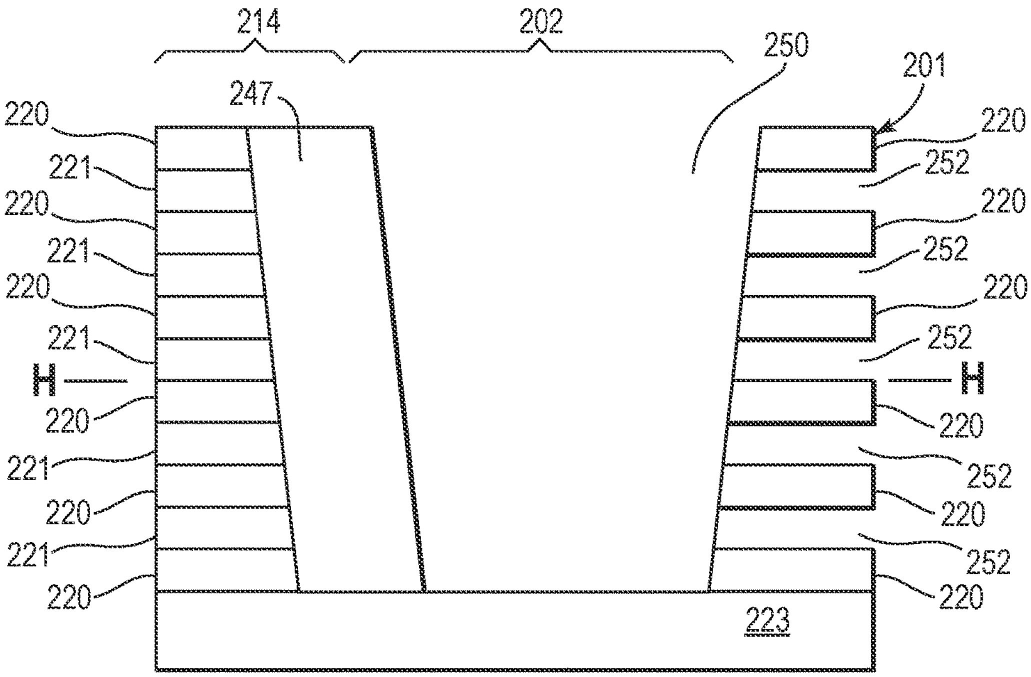
Figure 2K:
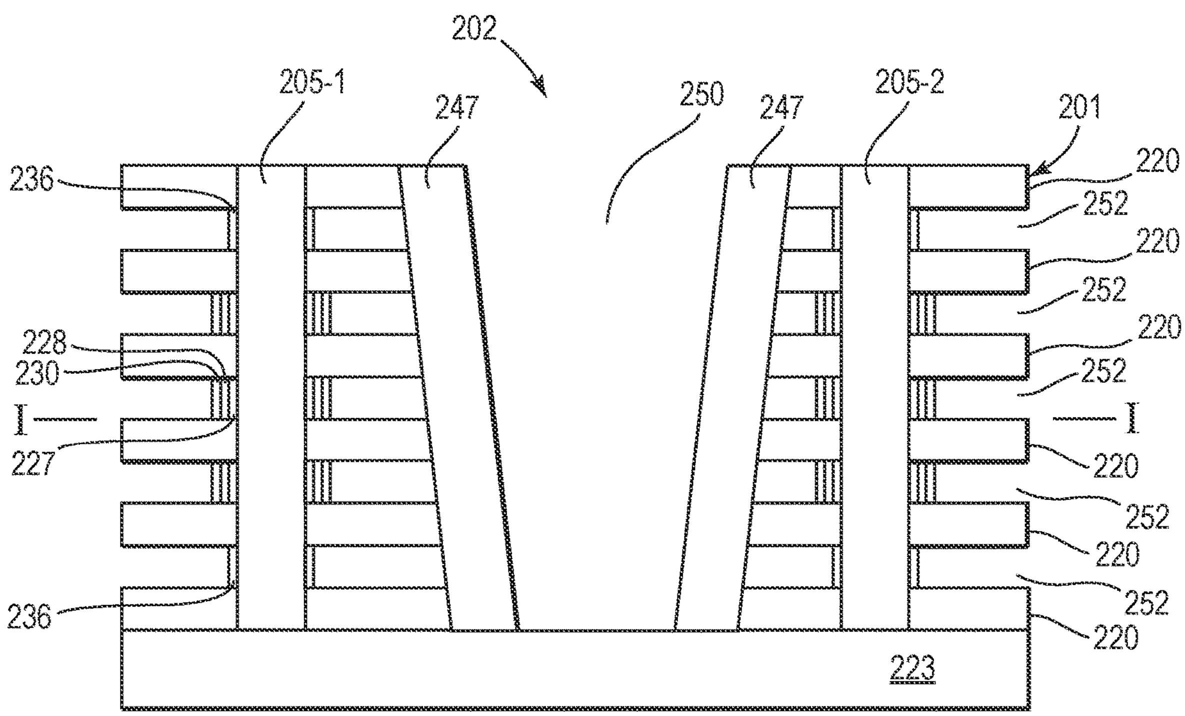
Figure 2L:
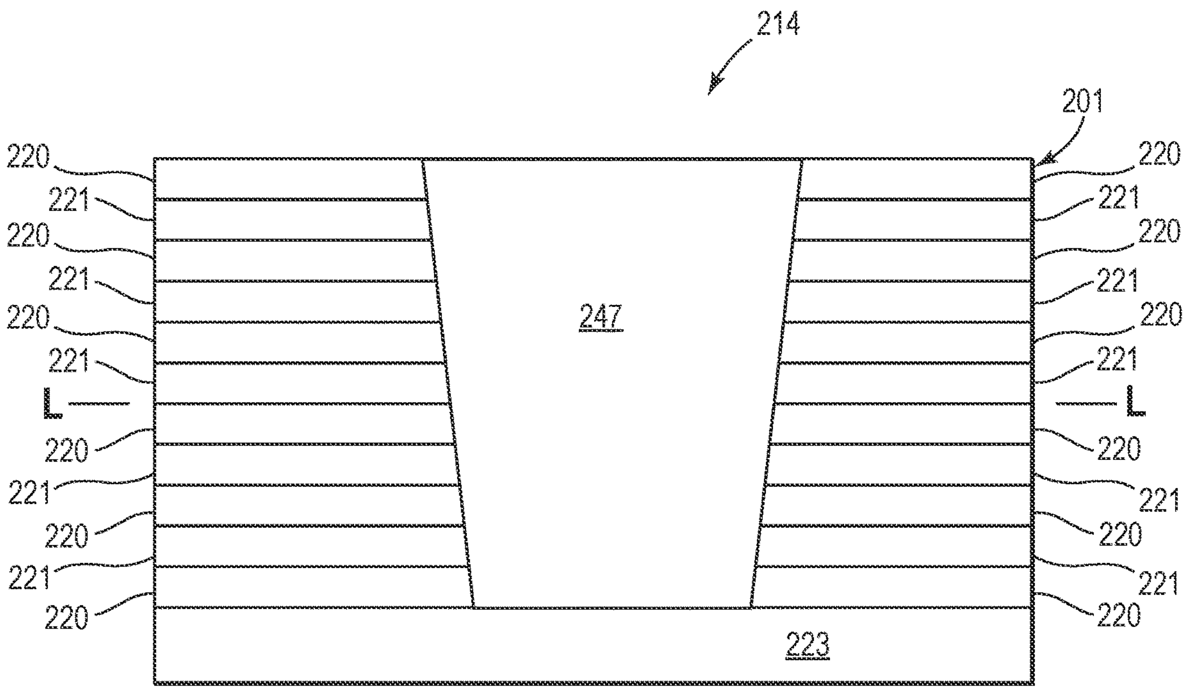

FIG. 2J is a cross-section viewed along line H-H in FIG. 2G during a subsequent processing step of the processing stage in FIG. 2G in accordance with a number of embodiments of the present disclosure. FIG. 2K is a cross-section viewed along line I-I in FIG. 2G during the subsequent processing step of the processing stage in FIG. 2G in accordance with a number of embodiments of the present disclosure. FIG. 2L is a cross-section viewed along line L-L in FIG. 2G during the subsequent processing step of the processing stage in FIG. 2G in accordance with a number of embodiments of the present disclosure.

Openings 250 can provide access to dielectrics 221 for the removal of dielectrics 221. For example, dielectrics 221 can be removed as part of a replacement gate process. A removal material, such as a wet etchant, can be supplied through openings 250 to remove dielectrics 221 to form a stack of dielectrics 220 alternating with spaces 252 in region 202, as shown in FIGS. 2J and 2K. Note that the uppermost and lowermost spaces 252 expose the gate dielectrics 236 and the spaces 252 between the uppermost and lowermost spaces 252 expose the blocking dielectrics 230. Dielectric extension 247 passes through a stack of alternating dielectrics 220 and 221 in region 214 as shown in FIG. 2L and through a stack of alternating dielectrics 220 and spaces 252 in region 202, as shown in FIG. 2K. In examples having a stair-step structure, the removal can remove a dielectric 221 from each of the steps.

Dielectric extensions 247 couple the alternating dielectrics 220 and 221 in region 214 to the alternating dielectrics 220 and 221 in region 202 while dielectrics 221 are removed. This coupling restricts movement of the semiconductor structures 205 that could occur while dielectrics 221 are removed. For example, the coupling can reduce the movement of the semiconductor structures relative to the movement of the semiconductor structures associated with transverse segment 112 in FIG. 1.

The removal material can flow into region 202 from the portions of openings 250 corresponding to the lengths L1 in FIG. 2G. However, the removal material may not flow from the portions of openings 250 that are overlapped by dielectric extensions 247. The distance D1 by which dielectric extensions 247 extend into region 202 can be selected to allow the removal material to penetrate the portions 256 of groups 218-1 and 218-2 that are between the portions of dielectric extensions 247 that are in region 202. The distance D1 can be further selected to limit the penetration of the removal material into region 214. For example, if the distance D1 is too great the removal material might not completely remove the dielectrics 221 from portions 256. If the distance D1 is too little, the removal material might remove too much of the dielectrics 221 from region 214.

The distance D2 by which dielectric extensions 247 extend into region 214 and the distance D1 can be such that the removal material does not make it around the ends of dielectric extensions 247. For example, extraneous removal material that makes it around the ends of dielectric extensions 247 could remove dielectric 221 from region 214 and provide a path around the ends of dielectric extensions 247 for extraneous metal during a subsequent metal processing step. For example, the metal could cause an electrical short between access lines corresponding to group 218-1 and access lines corresponding to group 218-2 that can be formed from the metal. Therefore, dielectric extensions 247 can act to block removal material, and thus the path of the metal, thereby preventing shorting from occurring between the access lines corresponding to group 218-1 and the access lines corresponding to group 218-2.

Figure 2M:
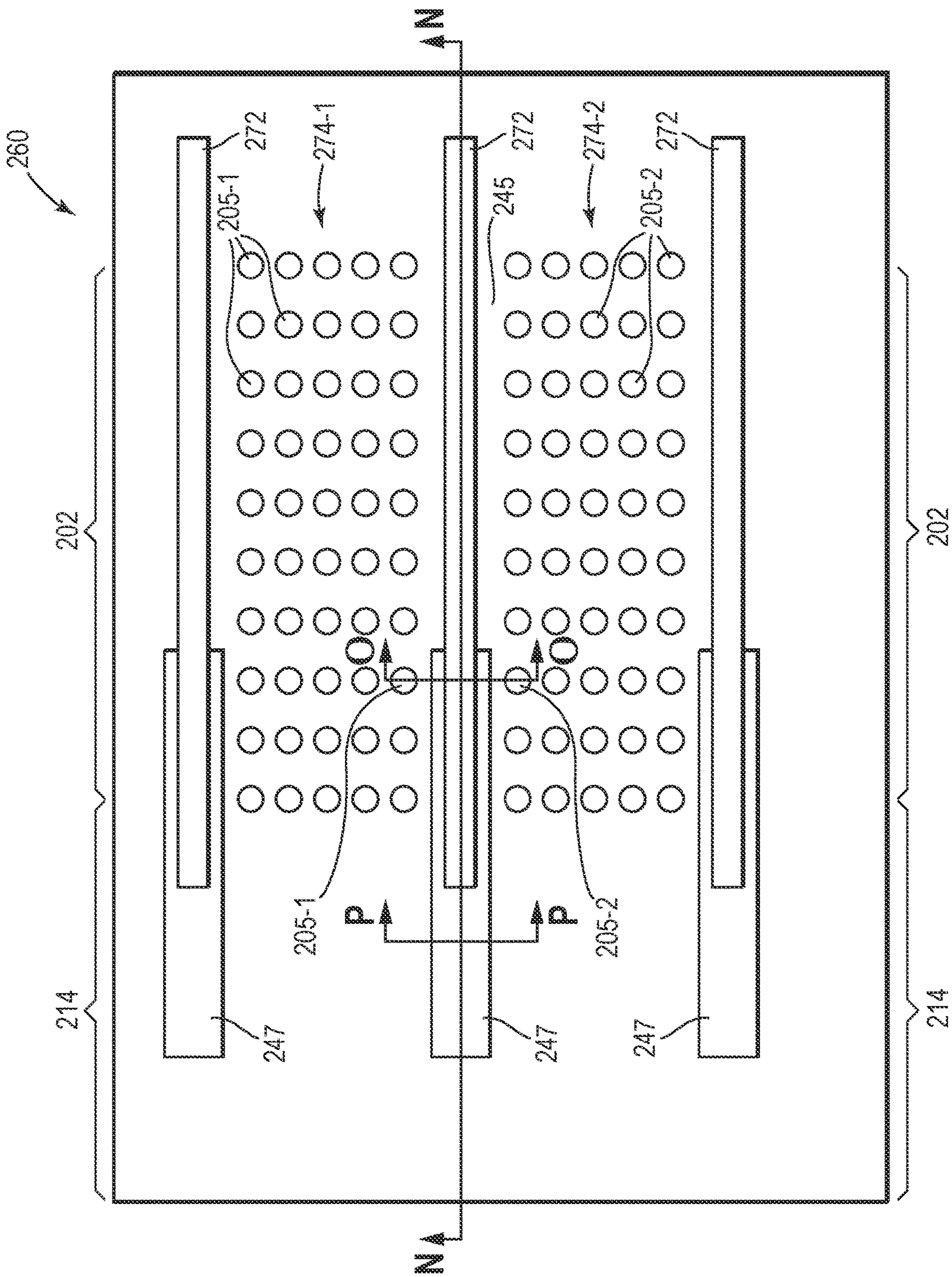
Figure 2N:
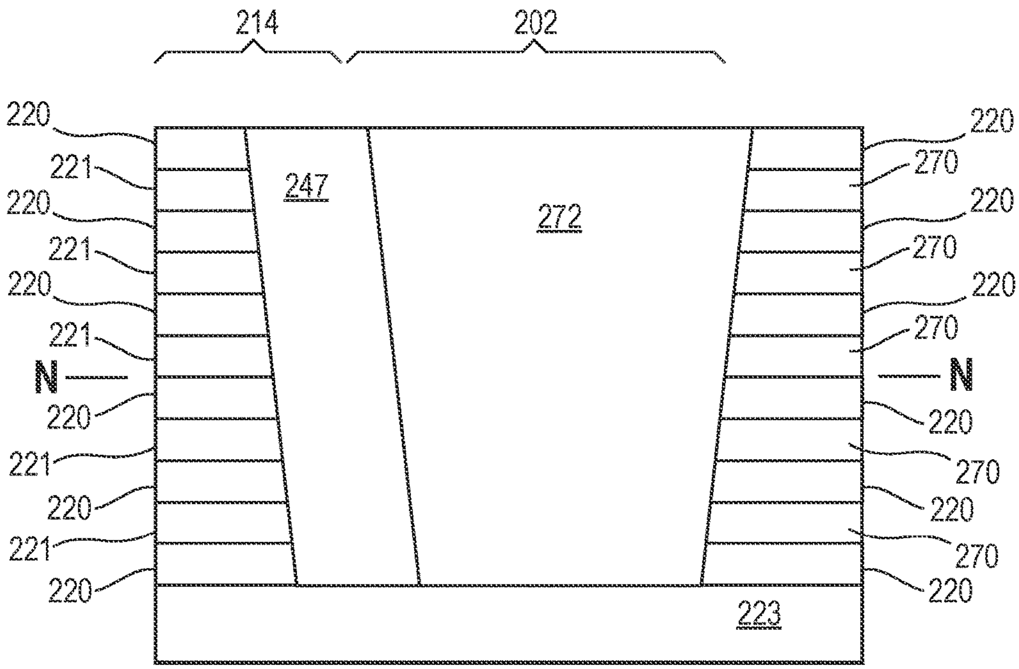
Figure 2O:
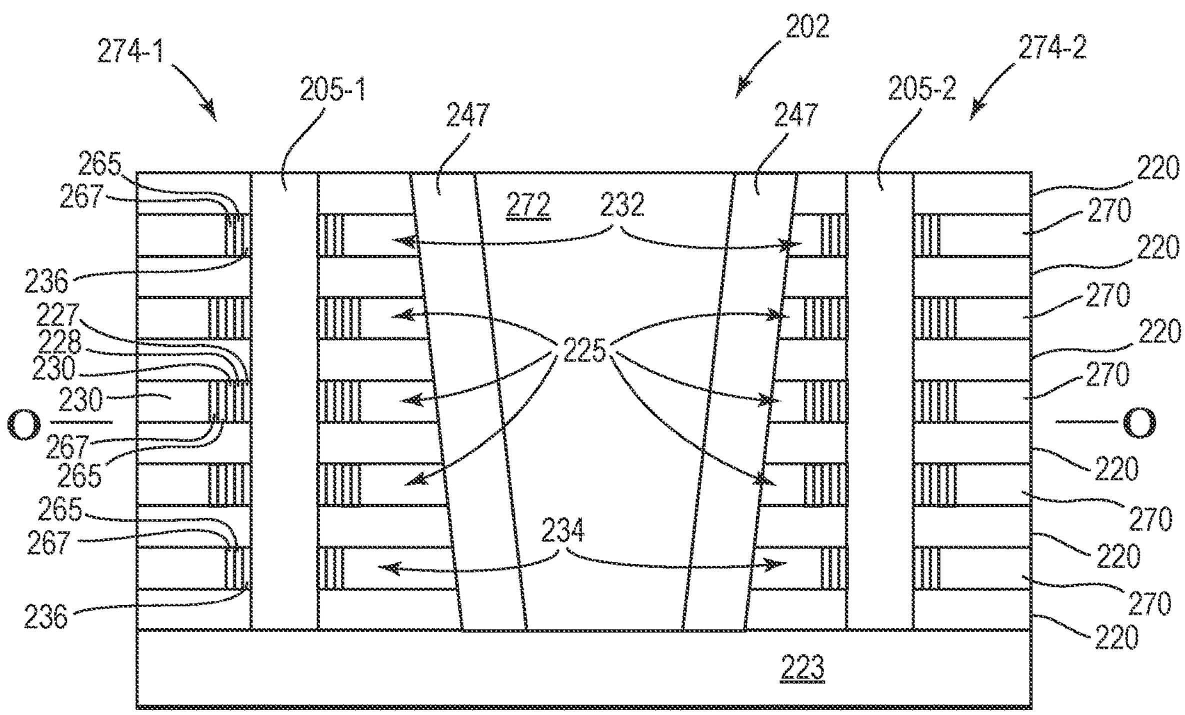
Figure 2P:
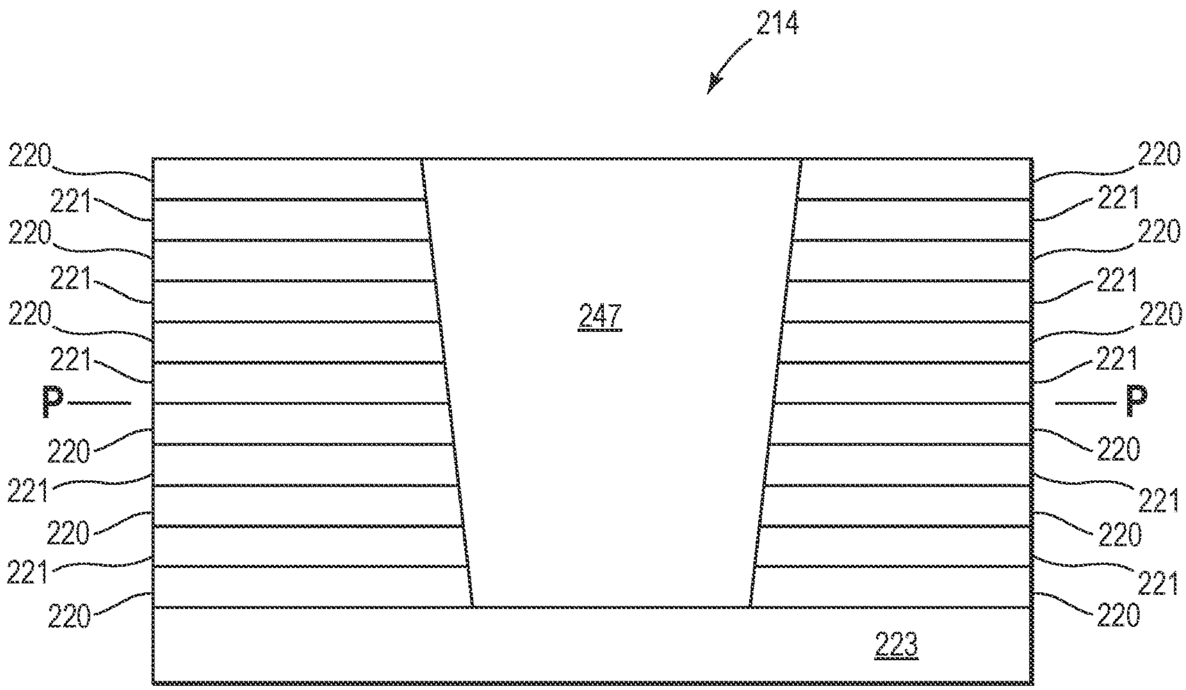

FIG. 2M is a top view corresponding to a stage of processing following the stage of processing of FIG. 2G, in accordance with a number of embodiments of the present disclosure. FIG. 2N is a cross-section viewed along line N-N in FIG. 2M during the processing stage in FIG. 2M in accordance with a number of embodiments of the present disclosure. FIG. 2O is a cross-section viewed along line O-O in FIG. 2M during the processing stage in FIG. 2M in accordance with a number of embodiments of the present disclosure. FIG. 2P is a cross-section viewed along line P-P in FIG. 2M during the processing stage in FIG. 2M in accordance with a number of embodiments of the present disclosure.

The processing stage depicted in FIGS. 2M-2P can form a memory array 260, for example. In some examples, the openings 250 in FIG. 2G provide access to the spaces 252 in FIGS. 2J and 2K to complete the formation of memory cells 225 and select transistors 232 and 234. For example, formation of memory cells 225 and select transistors 232 and 234 can be completed as part of a replacement gate process.

In some examples, a dielectric 265 can be supplied through openings 250 to form dielectric 265 in the spaces 252 adjacent to gate dielectrics 236 and blocking dielectrics 230. For example, dielectric 265 can be high dielectric constant (high-K) dielectric, such as alumina ($Al_2O_3$), hafnia ($HfO_2$), zirconia ($ZrO_2$), praeseodymium oxide ($Pr_2O_3$), hafnium tantalum oxynitride (HfTaON), hafnium silicon oxynitride (HfSiON), or the like. An interface metallic 267 (e.g., a barrier metal), such as tantalum nitride (TaN), titanaium nitride (TiN), or the like, can be supplied through openings 250 to form interface metallic 267 in the spaces 252 adjacent to dielectric 265.

A metal 270, such as tungsten, can be supplied through openings 250 to form metal 270 in the spaces 252 adjacent to interface metallic 267. For example, metal 270 can form access lines that can include control gates of memory cells 225 and control lines that can include gates of select transistors 232 and 236. For example, metal 270 can be formed in the spaces 252 as part of a replacement gate process. In some examples, dielectric 265, interface metallic 267, and metal 270 can wrap completely around the corresponding semiconductor structures 205. In examples having a stair-step structure, each step can include a level metal 270 over a dielectric 220.

In some examples, memory cells 235 can form a groups of series-coupled memory cells (e.g., a NAND strings) adjacent to semiconductor structures 205 and coupled in series with select transistors 232 and 236. Semiconductor 223 can be a source that can be selectively coupled to a group of series-coupled memory cells by select transistor 234. A data line (not shown) can be coupled to an end of a semiconductor structure 205 opposite to semiconductor 223. For example, select transistor 232 can selectively couple the data line to the group of series-coupled memory cells. The memory cells adjacent to semiconductor structures 205-1 can form a block 274-1 of memory cells, and the memory cells adjacent to semiconductor structures 205-2 can form a block 274-2 of memory cells.

Dielectric extensions 247 couple the alternating dielectrics 220 and 221 in region 214 to the dielectrics 220 in region 202 while metal 270 is being formed in the spaces 252. This coupling restricts movement of the semiconductor structures 205 that could occur while metal 270 is being formed in the spaces 252. For example, the coupling can reduce the movement of the semiconductor structures relative to the movement of the semiconductor structures associated with transverse segment 112. In some examples, the restricted movement of the semiconductor structures 205 can reduce the difficulties of aligning the data line contacts with the semiconductor structures associated with traverse segment 112. This can result in fewer "dummy" memory cells relative to the approach described in conjunction with FIG. 1, thus increasing the number of memory cells available to store data.

Dielectric extension 247 passes through a stack of alternating dielectrics 220 and 221 in region 214, as shown in FIG. 2P, and through a stack of alternating dielectrics 220 and metal 270 in region 202, as shown in FIG. 2O. Subsequently, a dielectric 272 is formed in openings 250 contiguous with dielectric extensions 247. For example, dielectric extension 247 can overlap dielectric 272 in region 245 of region 202, as shown in FIG. 2M, with a portion of dielectric extension 247 on either side of dielectric 272. For example, in region 245, a portion of dielectric extension 247 is between dielectric 272 and block 274-1 and another portion of dielectric extension 247 is between dielectric 272 and block 274-2. For example, dielectric extension 247 wraps around a portion of dielectric 272 in region 214. In some examples, dielectric 272 can be that same as dielectric 220.

Figure 3A:
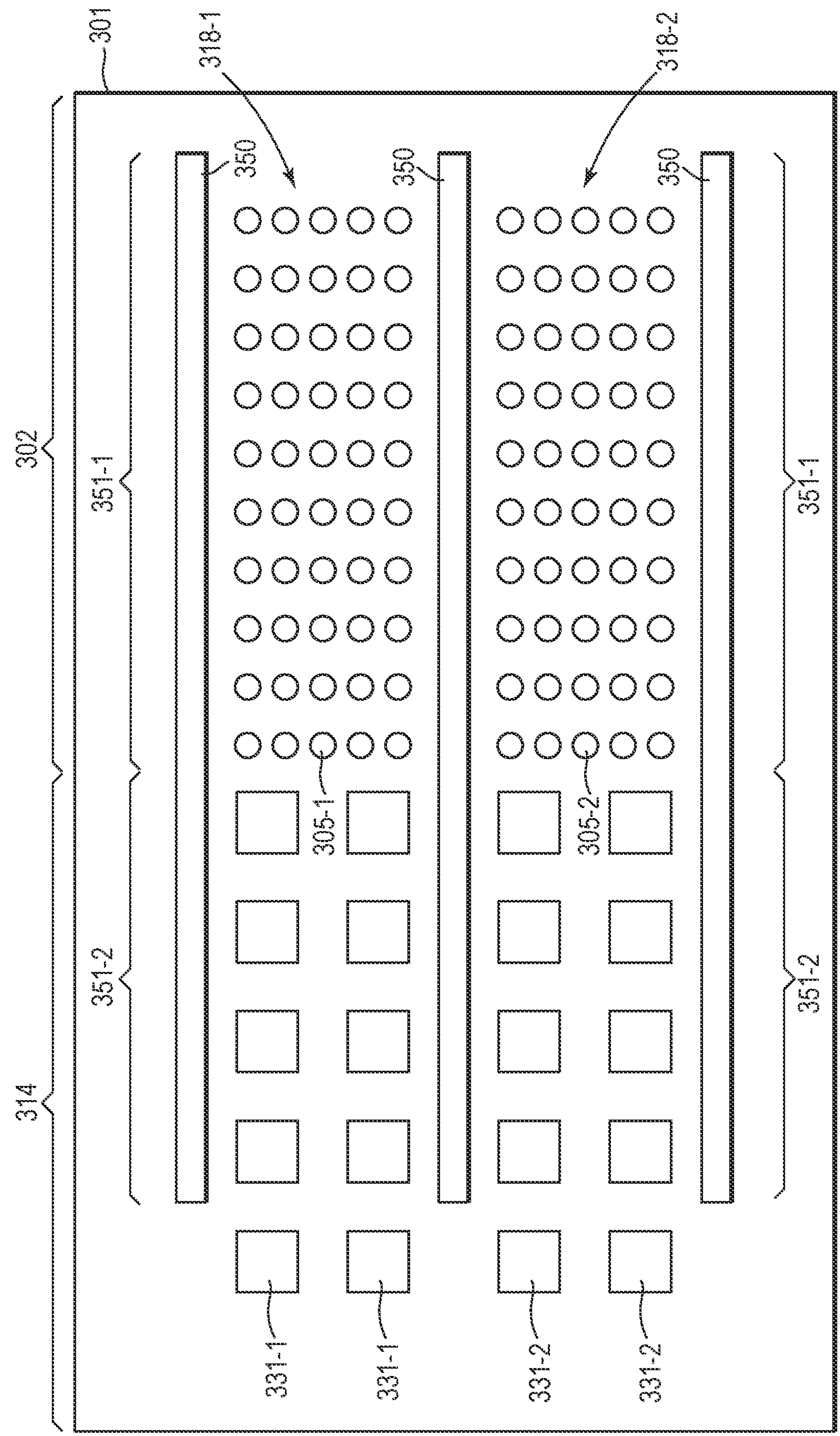
FIGS. 3A to 3D are top views corresponding to particular stages of processing associated with forming a stacked memory array in accordance with a number of embodiments of the present disclosure.

FIG. 3A is a top view corresponding to a particular stage of processing associated with forming a stacked memory array in accordance with a number of embodiments of the present disclosure. In some examples, the array can be a three-dimensional NAND memory array.

A group 318-1 of semiconductor structures 305-1 passes through a region 302 of a stack 301 of alternating dielectrics, such as alternating dielectrics 220 and 221 in FIG. 2C, formed on (e.g., over) a semiconductor, such as semiconductor 223. A group 318-2 of semiconductor structures 305-2 also passes through region 302 of a stack 301. In some examples, groups 318-1 and 318-2 can correspond to blocks of memory cells that are to be formed in region 302, and region 302 can be referred to as a memory cell region.

In some examples, stack 301 can be as described previously for stack 201; semiconductor structures 318 can be as described previously for semiconductor structures 218; and region 302 can be as described previously for region 202. In some examples, memory cells, such as the memory cells 225 in FIG. 2C, can be partially formed adjacent to each semiconductor structure 305 as described previously in conjunction with FIG. 2C.

Stack 301 can include a stair-step structure (not shown in FIG. 3A) adjacent to region 302 so that region 302 can be between the stair-step structure and a region 314. Respective steps of the stair-step structure can be at different levels in stack 301.

In some examples, region 314 can include groups of structures 331-1 and 331-2, such as pillars, that can pass through stack 301. Structures 331 can be support structures that can provide structural stability to stack 301 during the replacement gate process. For example, structures 331 can provide support that acts to stabilize and restrict movement of stack 301 during and after the removal of dielectrics, such as dielectrics 221, from stack 301. In some examples, structures 331 can be semiconductor structures, such as semiconductor pillars, that can be formed concurrently with semiconductor structures 318. Alternatively, structures 331 can be electrical contacts that can be coupled to routing circuitry of the array. Region 314 can be referred to as a non-memory-cell region because memory cells are not to be formed in region 314.

Openings 350 are formed through stack 301 during the processing stage corresponding to FIG. 3A. Each opening 350 can have a segment 351-1 in region 302 and a segment 351-2 in region 314. For example, an opening 350 can have a segment 351-1 between groups 318-1 and 318-2 and a segment 351-2 between structures 331-1 and 331-2.

Figure 3B:
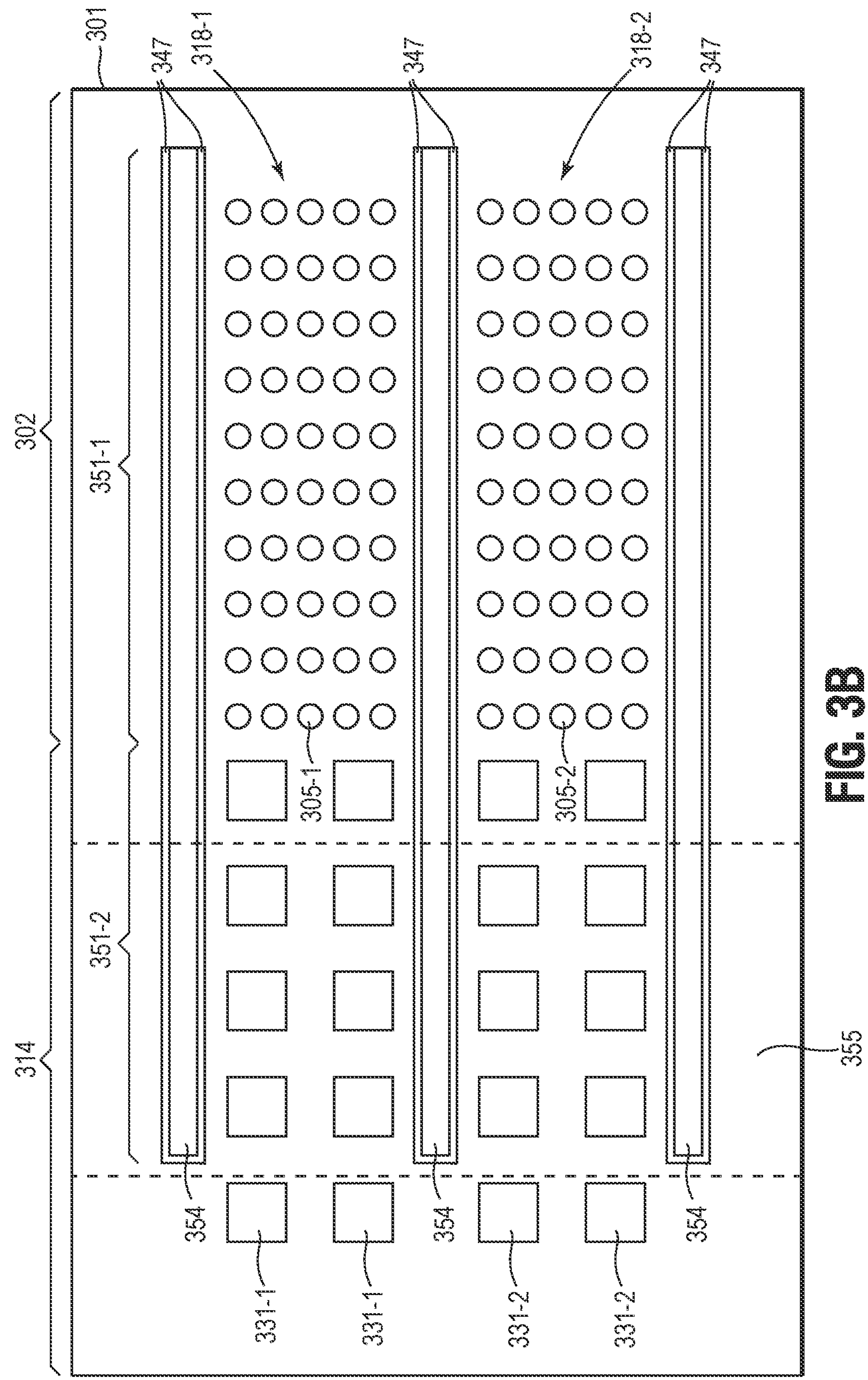

FIG. 3B is a top view corresponding to a stage of processing following the stage of processing of FIG. 3A in accordance with a number of embodiments of the present disclosure. Dielectric liners 347, such as oxide liners, are formed in openings 350 in FIG. 3A to line openings 350. For example, a dielectric liner 347 is formed in segments 351-1 and 351-2 of each opening 350. Subsequently, a sacrificial material 354 is formed in the lined openings 350 adjacent to dielectric liners 347. For example, sacrificial material 354 is formed in segments 351-1 and 351-2 adjacent to dielectric liner 347. In some examples, sacrificial material 354 can be a semiconductor, such as amorphous silicon, photoresist, such as negative photoresist, carbon, or the like.

A mask 355 is then formed over a portion of stack 301. For example, mask 355 can be formed over a portion of region 314 to cover a portion of the dielectric liners 347 and the sacrificial material 354 in region 314, as shown in FIG. 3B. For example, mask 355 can be formed over a portion of the dielectric liner 347 and the sacrificial material 354 formed in each segment 351-2.

Figure 3C:
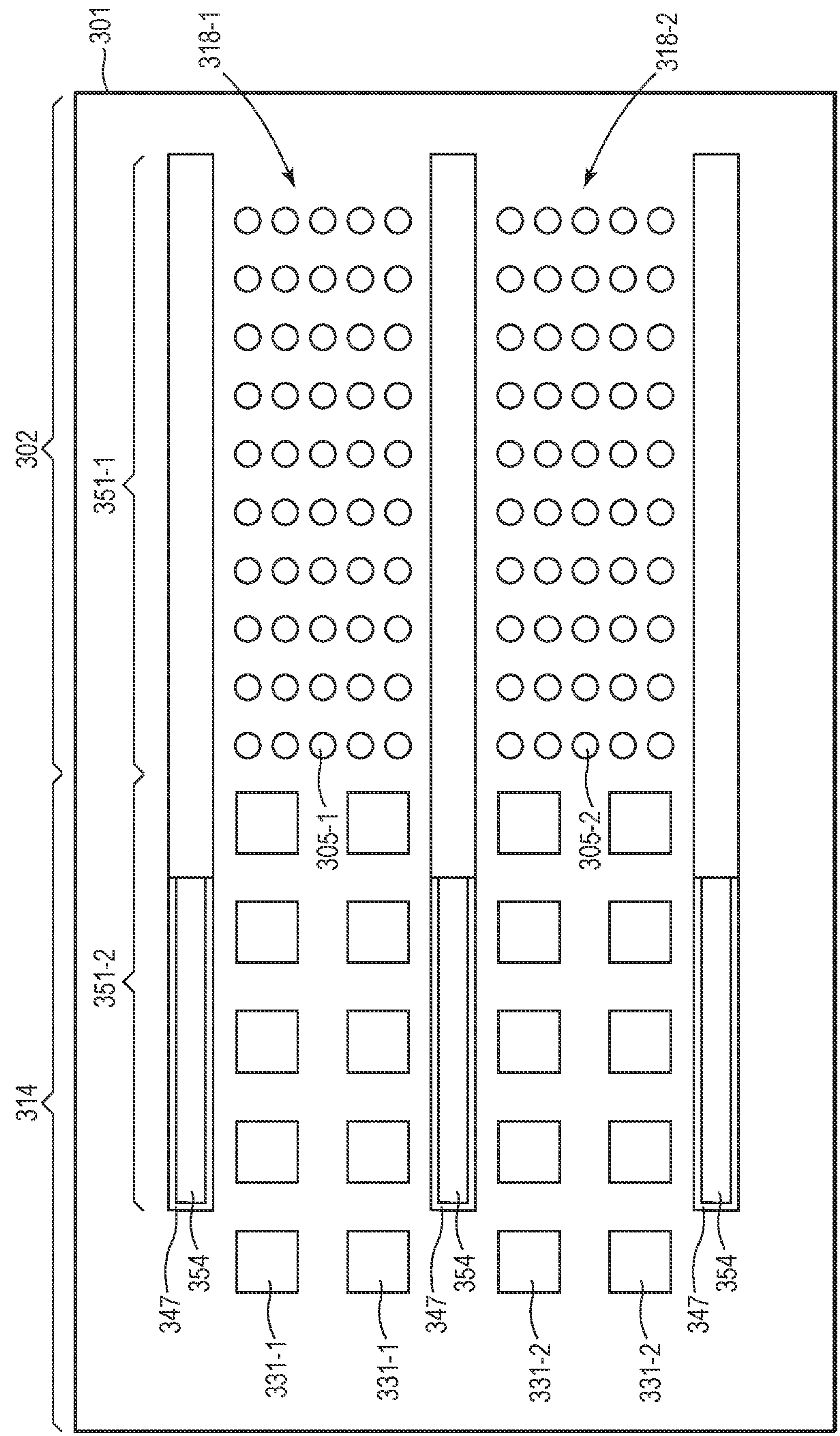

FIG. 3C is a top view corresponding to a stage of processing following the stage of processing of FIG. 3B in accordance with a number of embodiments of the present disclosure. Portions of dielectric liners 347 and sacrificial materials 354 in FIG. 3B are removed, as shown FIG. 3C. For example, the dielectric liner 347 and the sacrificial material 354 formed in the segments 351-1 are removed, leaving the dielectric liner 347 and the sacrificial material 354 formed in segments 351-2. In some examples, the dielectric liner 347 and the sacrificial material 354 formed in a portion of segments 351-2 can also be removed, leaving the dielectric liner 347 and the sacrificial material 354 another portion of segments 351-2, as shown FIG. 3C.

In some examples, the portions of the sacrificial materials 354 that are uncovered by mask 355 are removed, such as by a wet etch or by a reactive ion etch (ME), leaving the portions of the sacrificial materials 354 covered by mask 355 and leaving dielectric liners 347. Mask 355 can then be removed, and the portions of dielectric liners 347 where the sacrificial materials 354 have been removed can be removed, such as by an isotropic etch (e.g., a wet or a dry chemical isotropic etch). The remaining portions of the sacrificial materials 354 can act as masks, after mask 355 is removed, to protect the corresponding portions of the dielectric liners 347 during the removal of the portions of the dielectric liners 347 where the sacrificial materials 354 have been removed. However, in some examples, the ends of the remaining dielectric liners 347 can be recessed relative to the ends of the remaining sacrificial materials (not shown in FIG. 3C).

Alternatively, in examples in which the sacrificial materials 354 are photoresist, mask 355 can be omitted in FIG. 3B. For examples, in which sacrificial materials 354 are negative photoresist, the portions sacrificial materials 354 that are to remain can be exposed to electromagnetic radiation, such as light, and the portions of sacrificial materials 354 that are to be removed can be left unexposed. The unexposed portions of sacrificial materials 354 can then be removed as described previously, leaving the exposed portions of sacrificial materials 354 and leaving dielectric liners 347. The portions of dielectric liners 347 can then be removed as described previously.

Figure 3D:
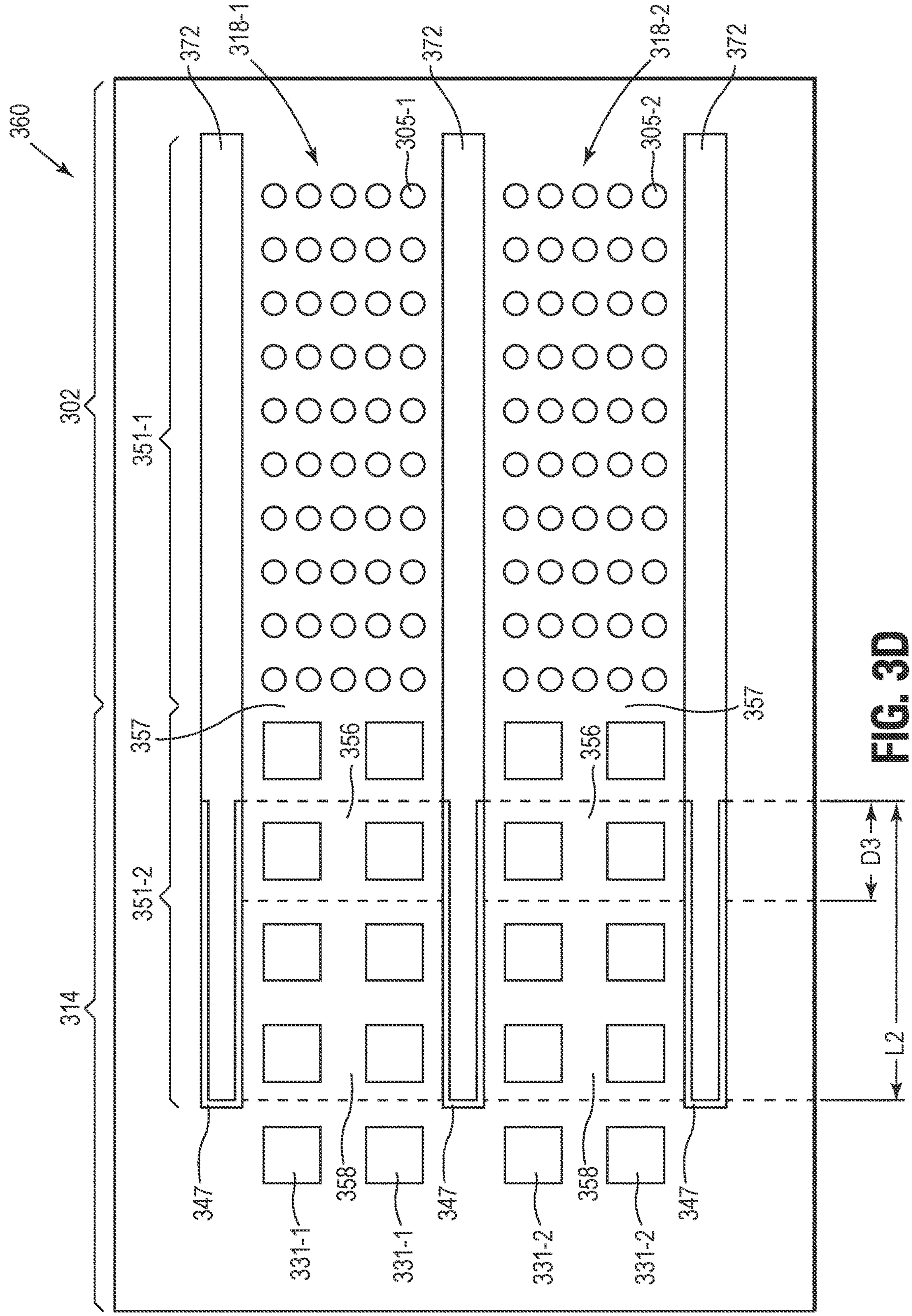

FIG. 3D is a top view corresponding to a stage of processing following the stage of processing of FIG. 3C in accordance with a number of embodiments of the present disclosure. For example, the processing stage corresponding to FIG. 3D can form a stacked memory array 360. During the processing stage corresponding to FIG. 3D, the remainder of sacrificial material 354 formed in each of segments 351-2 is removed so that a portion of each of segments 351-2 is lined with dielectric liner 347. For example, the remaining dielectric liner 347 can be referred to as a dielectric extension.

Dielectrics, such as dielectrics 221, in stack 301 can then be removed by accessing them through segments 351-1 and the unlined portions of segments 351-2. For example, a removal material can be supplied through segments 351-1 and the unlined portions of segments 351-2 to remove the dielectrics and form spaces, such as spaces 252 in FIGS. 2J and 2K, in place of the removed dielectrics.

The removal material can flow into region 302 from segment 351-1 in FIG. 3D to from the spaces in region 302 so that semiconductor structures 305 pass through a stack of the spaces alternating with dielectrics not removed by the removal material, such as dielectrics 220, as described previously for semiconductor structures 205 in conjunction with FIG. 2K.

Some of the removal material can also flow into portions 357 of region 314 that are between the portions of segments 351-2 unlined by dielectric liners 347. For example, the removal material can flow from the unlined portions of segments 351-2 to form the spaces in portions 357 so that the spaces alternate with the dielectrics not removed by the removal material in regions 357.

The removal material can also flow into the portions of segments 351-2 lined by dielectric liners 347. However, the dielectric liners 347 act to prevent any removal material from flowing from the portions of segments 351-2 lined by dielectric liners 347 into region 314. In some examples, the removal material flowing in segments 351-1 and the unlined portions of segments 351-2 can flow into portions 356 of region 314 that are between portions of segments 351-2 lined by dielectric liner 347 by up to a distance of D3 from the start of the unlined portions of segments 351-2, for example, from the locations where segments 351-2 transition from being unlined to being lined by dielectric liner 347.

Note that dielectric liners 347 prevent the removal material from flowing from the portions of segments 351-2 lined by dielectric liners 347 over the length L2 of the portions of segments 351-2 lined by dielectric liners 347. However, removal material from segments 351-1 and the unlined portions of segments 351-2 can flow into portions 356 of region 314. As such, the length L2, and thus the overall lengths of dielectric liners 347, including the end thicknesses, can be such that the removal material cannot make it around the ends of dielectric liners 347.

For example, extraneous removal material that makes it around the ends of dielectric liners 347 could remove dielectrics from around the ends of dielectric liners 347, providing a path around the ends of dielectric liners 347 for extraneous metal during a subsequent metal processing step. For example, the metal could cause an electrical short between access lines corresponding to group 318-1 and access lines corresponding to group 318-2 that can be formed from the metal. Therefore, dielectric liners 347 can act to block removal material, and thus the path of the metal, thereby preventing shorting from occurring between the access lines corresponding to group 318-1 and the access lines corresponding to group 318-2.

In some examples, portions 356 of region 314 can include a stack of the dielectrics not removed by the removal material alternating with the spaces. As such, the portions of dielectric liners 347 in portions 356 can pass the stack of the dielectrics alternating with the spaces. Portions 358 of region 314, however, can include a stack of alternating dielectrics, such as dielectrics 220 alternating with dielectrics 221 in a manner similar to that shown in FIG. 2J. As such, the portions of dielectric liners 347 in portions 358 can pass the stack of alternating dielectrics.

In some examples, segments 351-1 can provide access to the spaces to complete the formation of memory cells, such as memory cells 225 in FIG. 2O, adjacent to semiconductor structures 305 and select transistors, such as select transistors 232 and 234, adjacent to semiconductor structures 305 in a manner similar to that described previously in conjunction with FIG. 2O. For example, formation of the memory cells and select transistors can be completed as part of a replacement gate process.

Subsequently, metal, such as metal 270 in FIG. 2O, can be supplied through segments 351-1 and the unlined portions of segments 351-2 to form the metal in the spaces. For example, the metal can form access lines that can include control gates of the memory cells and control lines that can include gates of the select transistors. For example, the metal can be formed in the spaces as part of a replacement gate process.

In some examples, after the formation of the metal, the dielectric structures 305 can pass through a stack of the dielectrics not removed by the removal material, such as dielectrics 220 in FIG. 2O, alternating with the metal, as described previously in conjunction with FIG. 2O. Portions 356 and 357 of region 314 can also include stacks of dielectrics alternating with the metal. For example, the metal from the unlined portions of segments 351-2 can flow into portions 356. As such, segments 351-1 in region 302, the unlined portions of segments 351-2 in regions 357, and portions of the dielectric liners 347 in portions 356 can pass through a stack of dielectrics alternating with metal.

Portions 358 of region 314, however, can include a stack of alternating dielectrics, such as dielectrics 220 alternating with dielectrics 221. As such, the portions of dielectric liners 347 in portions 358 can pass through a stack of alternating dielectrics.

After the formation of the metal, a dielectric 372 that can be as previously described for the dielectric 272 can be formed in segments 351-1 in region 302, the unlined portions of segments 351-2 in portions 357, and in portions of segments 351-2 lined with dielectric liners 347 in portions 358. For example, dielectric 372 can be formed adjacent to dielectric liners 347. As such, the dielectric in segments 351-1 in region 302 and in the unlined portions of segments 351-2 can pass through a stack of dielectrics alternating with metal.

Note that the dielectric liners 347 overlap dielectrics 372 in region 314. For example, each dielectric liner 347 in region 314 wraps around a portion of a respective dielectric 372 in region 314.

The dielectric liners 347 formed in conjunction with FIGS. 3A to 3D can help isolate blocks of memory cells corresponding to the groups 318-1 and 318-2 from each other without forming "T-intersections," thereby avoiding the difficulties and drawbacks associated therewith.

Figure 4:
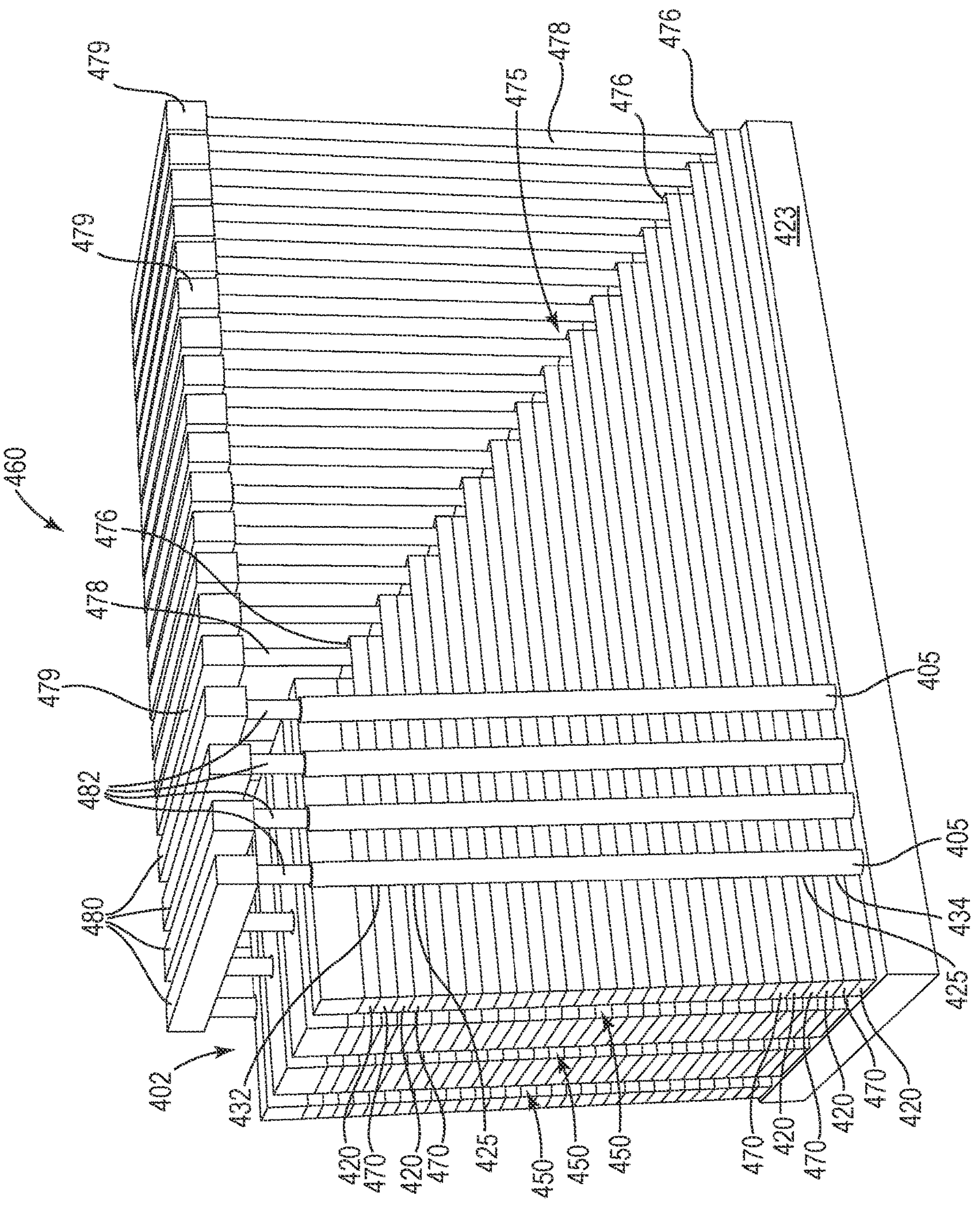
FIG. 4 illustrates a stacked memory array in accordance a number of embodiments of the present disclosure.

FIG. 4 illustrates a stacked memory array, such as stacked memory array 460, in accordance a number of embodiments of the present disclosure. For example, array 460 can include a region 402 (e.g., a memory-cell region) that can correspond to region 202 in FIGS. 2A, 2D, 2G, and 2M or region 302 in FIGS. 3A to 3D. Array 460 includes a stair-step structure 475 adjacent to region 402.

Array 460 can include a stack of dielectrics 420 alternating with levels of metal 470. Semiconductor structures 405 pass through the stack in region 402 and terminate at an upper surface of or in a semiconductor 423. A select transistor 432 can be adjacent to each semiconductor structure 405 at a level corresponding to the uppermost level of metal 470, and a select transistor 434 can be adjacent to each semiconductor structure 405 at a level corresponding to the lowermost level of metal 470. Memory cells 425 can be adjacent to each semiconductor structure 405 at levels corresponding to the levels of metal 470 between the uppermost and lowermost levels of metal 470. For example, semiconductor structures 405, dielectrics 420, semiconductor 423, and metal 470 can be as previously described for semiconductor structures 205, dielectrics 220, semiconductor 223, and metal 270, respectively.

The uppermost and lowermost levels of metal 470 can be control lines that form or are coupled to control gates of select transistors 432 and 434, respectively. The levels of metal 470 between the uppermost and lowermost levels of metal 470 can be access lines that form or are coupled to control gates of memory cells 425.

Stair-step structure 475 includes steps 476 that can each include a respective level of metal 470 over an adjacent dielectric 420. A respective contact 478 is coupled to the level of metal 470 of each respective step 476. Respective contacts 478 can be coupled to activation (e.g., access) circuitry by respective lines 479. Data lines 480 are coupled to semiconductor structures 405 by data line contacts 482.

Openings 450 are formed through the stack. Openings 450 can be as previously described for openings 250 in conjunction with FIGS. 2G to 2L. Openings 450 can terminate at dielectric extensions in a manner similar to (e.g., the same as) the way openings 250 terminate in dielectric extensions 247. In some examples, openings 450 can be as previously described for openings 350. For example, dielectric extensions, such as dielectric liners 347, can line segments of openings 450 in a manner similar to (e.g., the same as) the way dielectric liners 347 line segments of openings 350.

The dielectric extensions can provide more compact isolations between adjacent blocks on either side of openings 450 in FIG. 4 compared to previous approaches. For example, some previous approaches may add another stair-step structure opposite to stair-step structure 475 in FIG. 4 to isolate adjacent blocks on either side of openings 450. However, the added stair-step structure can take up additional space compared to the dielectric extensions.

Figure 5:
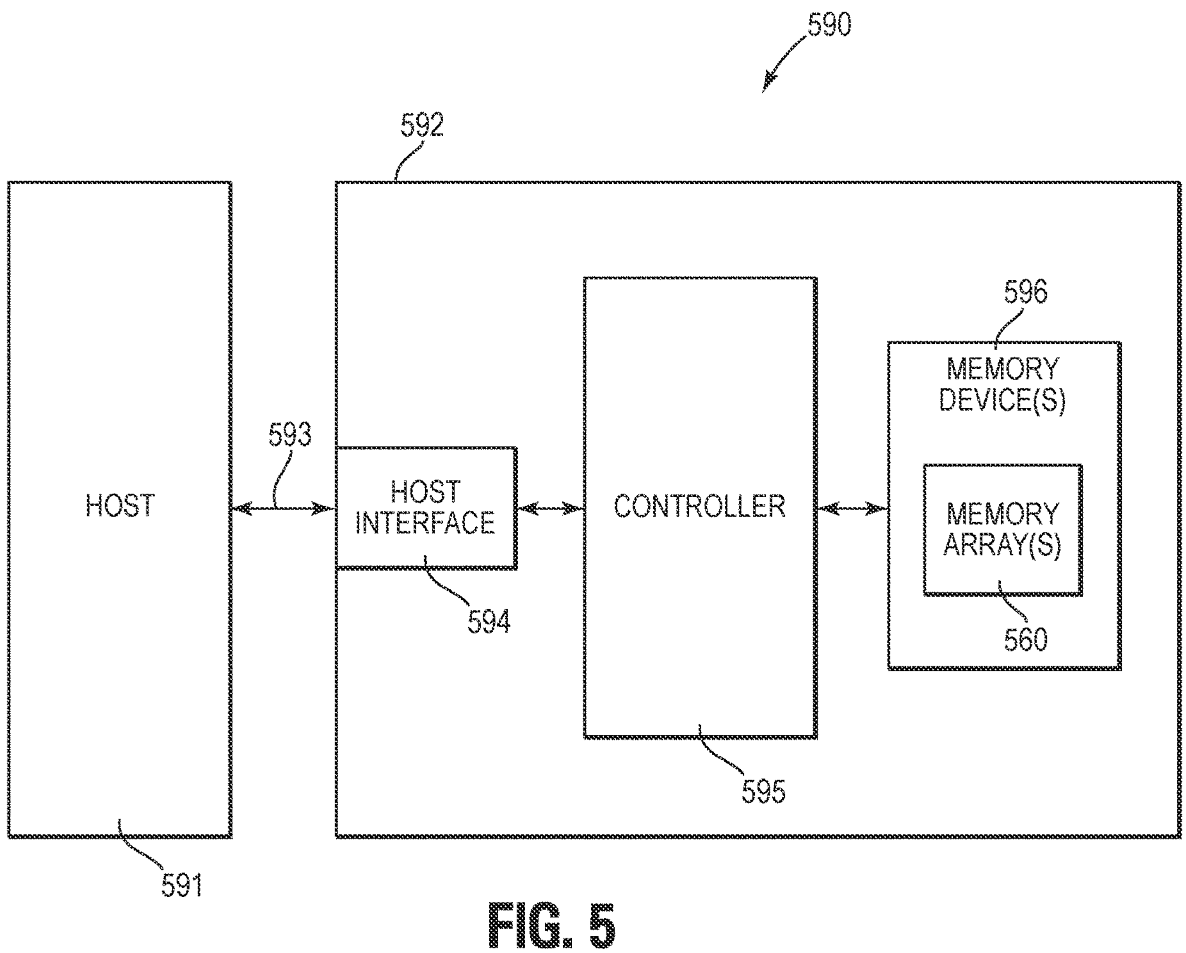
FIG. 5 is a block diagram of an apparatus in accordance a number of embodiments of the present disclosure.

FIG. 5 is a block diagram of an apparatus in accordance a number of embodiments of the present disclosure. For example, the apparatus can be an electronic system, such as a computing system 590. Computing system 590 can include a memory system 592 that can be a solid-state drive (SSD), for instance. Memory system 592 can include a host interface 594, a controller 595, such as a processor and/or other control circuitry, and a number of memory devices 596, such as NAND flash devices, that provide a storage volume for the memory system 592. A memory device 596 can have a number of memory arrays 560, such as memory array 260 shown in FIGS. 2M to 2P, memory array 360 shown in FIG. 3D, or memory array 460 shown in FIG. 4.

Controller 595 can be coupled to the host interface 594 and to the number of memory devices 596 via one or more channels and can be used to transfer data between the memory system 592 and a host 591. Host 591 can be coupled to the host interface 594 by a communication channel 593. Host 491 can be a host system such as a personal laptop computer, a desktop computer, a digital camera, a mobile telephone, or a memory card reader, among various other types of hosts.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

As used herein, "a" or "an" can refer to one or more of something, and "a number of" something can refer to one or more of such things. For example, a number of memory cells can refer to one or more memory cells. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship). As used herein, multiple acts being performed concurrently refers to acts overlapping, at least in part, over a particular time period.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method of forming a stacked memory array, comprising:

forming a stack of alternating first and second dielectrics;

forming an opening through the stack so that a first segment of the opening is between a first group of semiconductor structures and a second group of semiconductor structures in a first region of the stack in which memory cells are to be formed and so that a second segment of the opening is in a second region of the stack in which memory cells are not to be formed;

lining the first and second segments with a dielectric liner;

forming a sacrificial material adjacent to the dielectric liner in the first and second segments;

removing the sacrificial material and the dielectric liner formed in the first segment;

after removing the sacrificial material and the dielectric liner formed in the first segment, removing the sacrificial material formed the second segment leaving the dielectric liner in the second segment;

removing the first dielectrics from the first region by accessing the first dielectrics through the first segment while the dielectric liner is in the second segment and while the dielectric extension is in the second segment, supplying metal through the first segment to form the metal in spaces in the first region formed by removing the first dielectrics.

2. The method of claim 1, further comprising supplying the metal through the first segment as part of a replacement gate process.

3. The method of claim 1, wherein the sacrificial material is a photoresist.

4. The method of claim 1, wherein the sacrificial material is a semiconductor material.

5. The method of claim 1, wherein one of the first and the second dielectrics is an oxide and the other of the first and the second dielectrics is a nitride.

6. The method of claim 1, wherein the dielectric liner provides electrical isolation between the first region and the second region without the use of a slot etch transverse to the opening.

7. The method of claim 1, further comprising forming a mask over the second region to facilitate removal of the sacrificial material and the dielectric liner formed in the first segment.

8. A method of forming a stacked memory array, comprising:

forming a stack of alternating first and second dielectric materials;

forming a partition wall by:

forming an opening through the stack such that a first portion of the opening is between a first memory cell region and a second memory cell region of the stack and such that a second portion of the opening is in a different region of the stack;

forming a dielectric liner in the first and second portions of the opening;

forming a sacrificial material in the first a second portions of the opening;

removing the sacrificial material and the dielectric liner formed in the first portion;

performing a replacement gate process by:

removing portions of the first dielectric material from the stack of alternating materials in the memory cell region; and replacing the removed portions of the first dielectric material with a metal material, wherein the dielectric liner formed in the second portion provides a guard band that prevents extraneous metal formation through the second portion of the opening during the replacement gate process.

9. The method of claim 8, wherein the different region of the stack is a region in which memory cells are not formed.

10. The method of claim 8, wherein forming the sacrificial material in the first and second portions of the opening includes filling a remainder of the opening with the sacrificial material.

11. The method of claim 8, wherein after removing the sacrificial material and the dielectric liner formed in the first portion, removing the sacrificial material formed in the second portion .

12. The method of claim 8, wherein the dielectric liner comprises an oxide material.

13. The method of claim 8, wherein performing the replacement gate process comprises forming gates of NAND memory cells.

14. A stacked memory array, comprising:

a memory cell region comprising first and second groups of memory cells;

a first dielectric between the first and second groups in the memory cell region and comprising a portion that extends into a non-memory-cell region; and a dielectric liner in the non-memory-cell region that wraps around the portion of first dielectric;

wherein the first dielectric passes through alternating instances of a second dielectric and a conductive access line material in the memory cell region; and wherein the dielectric liner passes through alternating instances of the second dielectrics and third dielectrics in the non-memory-cell-region.

15. The memory array of claim 14, wherein the first dielectric is formed in contact with the dielectric liner.

16. The memory array of claim 14, wherein the first and second groups of memory cells comprise strings of NAND memory cells.

17. The memory array of claim 14, wherein the non-memory-cell region comprises semiconductor pillars.

18. A method of forming a stacked memory array, comprising:

forming a stack of alternating first and second dielectrics;

forming an opening through the stack so that a first segment of the opening is between a first group of semiconductor structures and a second group of semiconductor structures in a first region of the stack in which memory cells are to be formed and so that a second segment of the opening is in a second region of the stack in which memory cells are not to be formed;

lining the first and second segments with a dielectric liner;

forming a sacrificial material adjacent to the dielectric liner in the first and second segments;

removing the sacrificial material and the dielectric liner formed in the first segment;

after removing the sacrificial material and the dielectric liner formed in the first segment, removing the sacrificial material formed the second segment leaving the dielectric liner in the second segment; and forming a dielectric in the first segment and adjacent to the dielectric liner in the second segment.

* * * * *